United States Patent

Araki et al.

[11] Patent Number: 5,874,886
[45] Date of Patent: Feb. 23, 1999

[54] MAGNETORESISTANCE EFFECT ELEMENT AND MAGNETORESISTANCE DEVICE

[75] Inventors: Satoru Araki, Chiba; Daisuke Miyauchi, Nagano, both of Japan

[73] Assignee: TDK Corporation, Tokyo, Japan

[21] Appl. No.: 837,649

[22] Filed: Apr. 22, 1997

Related U.S. Application Data

[63] Continuation of Ser. No. 498,780, Jul. 5, 1995, abandoned.

[30] Foreign Application Priority Data

Jul. 6, 1994  [JP]  Japan .................................. 6-154599

[51] Int. Cl.$^6$ ................................................. H01L 43/00
[52] U.S. Cl. .................. 338/32 R; 360/126; 324/207.21
[58] Field of Search ...................... 338/32 R; 324/207.21, 324/249, 252; 365/158, 171; 360/113, 126

[56] References Cited

U.S. PATENT DOCUMENTS

| | | | |
|---|---|---|---|
| 4,079,430 | 3/1978 | Fujishima et al. | 360/126 |
| 4,488,195 | 12/1984 | Yanagiuchi et al. | 360/126 |
| 4,907,114 | 3/1990 | Shiiki et al. | 360/113 |
| 4,940,511 | 7/1990 | Fontana et al. | 360/113 |
| 4,949,039 | 8/1990 | Grünberg . | |
| 5,134,533 | 7/1992 | Friedrich et al. | 360/113 |
| 5,155,644 | 10/1992 | Kira et al. | 360/113 |
| 5,243,316 | 9/1993 | Sakakima et al. | 338/32 R |
| 5,304,975 | 4/1994 | Saito et al. | 338/32 R |
| 5,331,728 | 7/1994 | Argyle et al. | 360/126 |
| 5,366,815 | 11/1994 | Araki et al. . | |
| 5,452,163 | 9/1995 | Coffey et al. | 360/113 |
| 5,475,550 | 12/1995 | George | 360/113 |
| 5,549,978 | 8/1996 | Iwsaski et al. | 428/692 |
| 5,552,949 | 9/1996 | Hashimoto et al. | 360/113 |

FOREIGN PATENT DOCUMENTS

| | | | |
|---|---|---|---|
| 5-347013 | 12/1993 | Japan . | |
| 6-177453 | 6/1994 | Japan | 338/32 R |

OTHER PUBLICATIONS

Ohring, "The Materials Science of Thin Films" Ch. 5.5.2–5.5.3, 1992.

Hiroshi Sakakima & Mitsuo Satomi, Magnetoresistance in[Cu/{Fe–Mn/M/Cu/M}] Spin–Value Multilayers, Jpn.J. Appl. Phys. vol. 32 (1993) pp. L 1441–L 1443, Part 2, No. 10A, Oct. 1, 1993.

Giant Magnetoresistance of Magnetically Soft Sandwiches: Dependence on Temperature and on Layer Thickness, B. Dieny, P. Humbert, V.S. Speriosu, S. Metin, B.A. Gurney, P. Baumgart and H. Lefakis vol. 45, No. 2, Jan. 1, 1992–II, Physical Review B.

Spin–Valve Effect in Soft Ferromagnetic Sandwiches, B. Dieny, V.S. Speriosu, B.A. Gurney, S.S.P. Parkin, D.R. Wilhoit, K.P. Roche, S. Metin, D.T. Peterson and S. Nadimi, Journal of Magnetism and Magnetic Materials 93 (1991) 101–104.

Giant Magnetoresistance in Soft Ferromagnetic Multilayers, B.Dieny, V.S. Speriousu, S.S.P. Parkin, B.A. Gurney, D.R. Wilhoit and D. Mauri, vol. 43, No. 1, Jan. 1, 1991, Physical Review B.

Giant Magnetoresistance of (001)Fe/(001) Cr Magnetic Superlattices, M. N. Baibich, J.M. Broto, A. Fert, F. Nguyen Van Dau, and F. Petroff, Nov. 21, 1988, vol. 61, No. 21, Physical Review Letters.

*Primary Examiner*—Renee S. Luebke
*Assistant Examiner*—Karl Easthom
*Attorney, Agent, or Firm*—Oblon, Spivak, McClelland, Maier & Neustadt, P.C.

[57] ABSTRACT

A magnetoresistance effect element according to the present invention comprises magnetic multilayer film having a non-magnetic metal layer, a ferromagnetic layer formed on one surface of the non-magnetic metal layer, a soft magnetic layer formed on the other surface of the non-magnetic metal layer, and a pinning layer which is formed on the ferromagnetic layer to pin a direction of magnetization of the ferromagnetic layer, wherein the ferromagnetic layer and the pinning layer are coupled to each other with epitaxial growth.

18 Claims, 12 Drawing Sheets

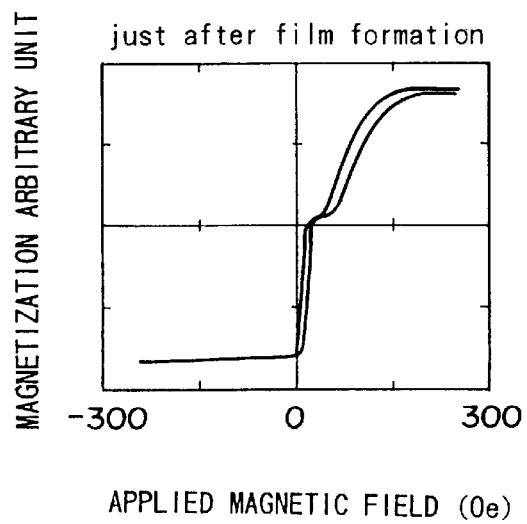
FIG.10(A) just after film formation
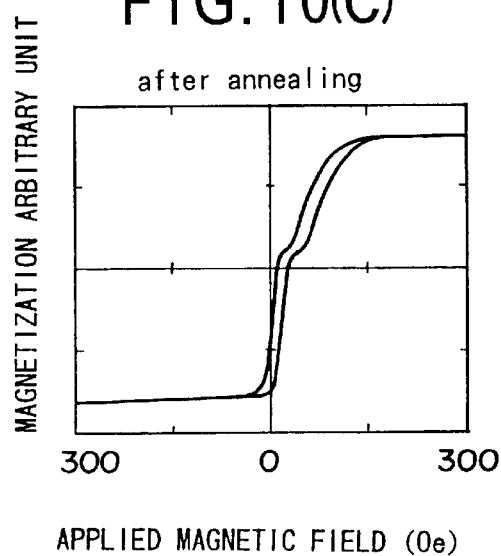
FIG.10(C) after annealing
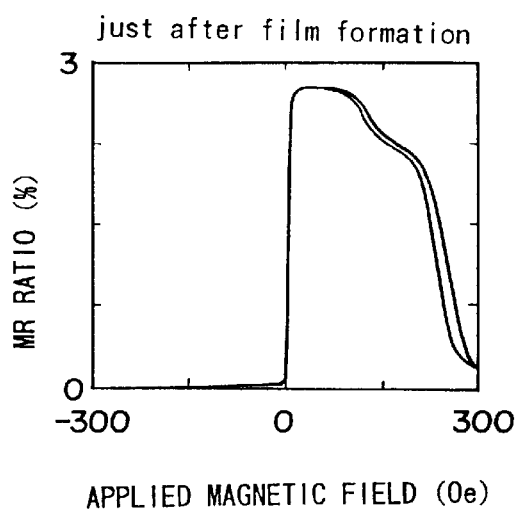
FIG.10(B) just after film formation
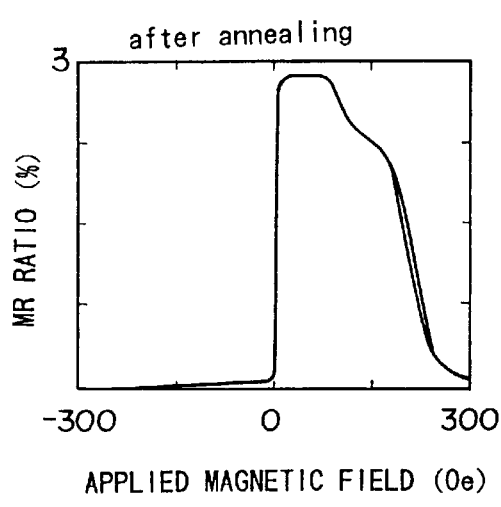
FIG.10(D) after annealing

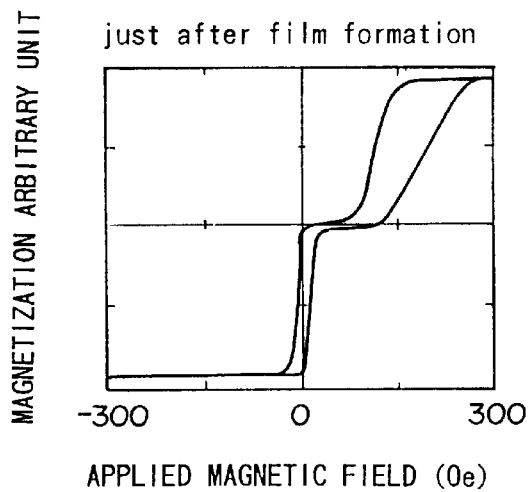
FIG. 11(A) just after film formation
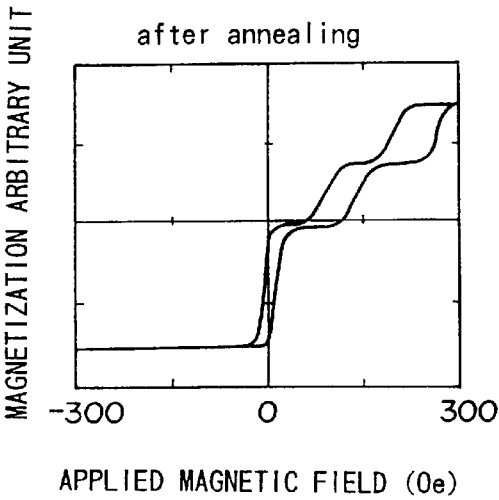
FIG. 11(C) after annealing
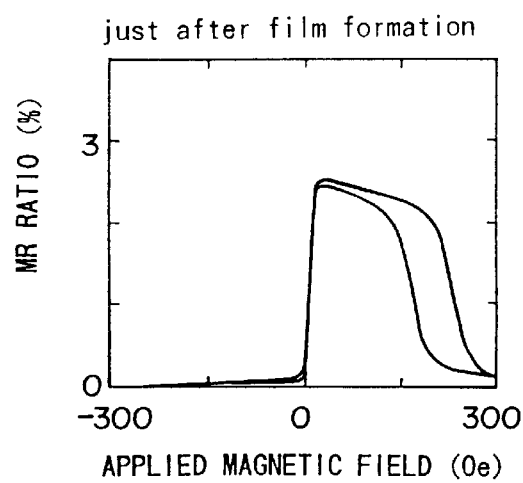
FIG. 11(B) just after film formation
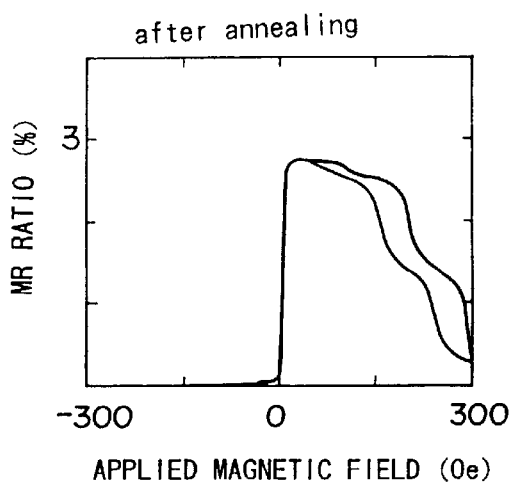
FIG. 11(D) after annealing just after film formation after annealing

MAGNETORESISTANCE EFFECT ELEMENT AND MAGNETORESISTANCE DEVICE

This application is a Continuation of application Ser. No. 08/498,780, filed on Jul. 5, 1995, now abandoned.

BACKGROUND OF THE INVENTION

1. Field of the Invention

The present invention relates to a magnetoresistance effect element for reading the magnetic field intensity of magnetic recording media as signals, especially a magnetoresistance effect element capable of reading a small magnetic field change as a greater electrical resistance change signals, and a magnetoresistance device such as a magnetoresistance effect type head or the like using the same.

2. Prior Art

There are recently growing demands for increasing the sensitivity of magnetic sensors and increasing the density of magnetic recording, and active research works have been devoted for the development of magnetoresistance effect type magnetic sensors (hereinafter referred to as MR sensors) and magnetoresistance effect type magnetic heads (hereinafter referred to as MR heads). Both MR sensors and MR heads are designed to read out external magnetic field signals on the basis of the variation in resistance of a reading sensor portion formed of magnetic material. The MR sensors have an advantage that a high sensitivity can be obtained and the MR heads have an advantage that a high output can be obtained in high density magnetic recording because the reproduced output does not depend on the relative speed of the sensors or heads to the recording medium.

However, conventional MR sensors which are formed of magnetic materials such as $Ni_{0.8}Fe_{0.2}$ (Permalloy), NiCo or the like have a small magnetoresistance change $\Delta R/R$ which is about 1 to 3% at maximum, and thus these materials have insufficient sensitivity as the reading MR head materials for ultrahigh density recording of the order of several giga bit per square inch (GBPI) or more.

Attention has been recently paid to artificial superlattices having the structure in which thin films of metal having a thickness of an atomic diameter order are periodically stacked, because their behavior is different from that of bulk metal. One of such artificial superlattices is a magnetic multilayer film having ferromagnetic metal thin films and antiferromagnetic metal thin films alternately deposited on a substrate. Heretofore, magnetic multilayer films of iron-chromium and cobalt-copper types have been known. Among these materials, the iron-chromium (Fe/Cr) type was reported to exhibit a magnetoresistance change which exceeds 40% at an extremely low temperature (4.2K) (see Phys. Rev. Lett., Vol. 61, p2472, 1988). However, this artificial superlattice magnetic multilayer film is not commercially applicable if it is left as it is because the external magnetic field at which a maximum resistance change occurs (that is, operating magnetic field intensity), is as high as ten to several tens of kilo-oersted. Additionally, there have been proposed artificial superlattice magnetic multilayer films of Co/Ag, which require too high operating magnetic field intensity.

Under these circumstances, a new structure which is called as a spin valve film is proposed. In this structure, two NiFe layers are formed through a non-magnetic layer, and an FeMn layer is further formed so as to be adjacent to one of the NiFe layers. In this case, since the FeMn layer and the NiFe layer adjacent thereto are directly exchange-coupled to each other, the direction of the magnetic spin of this NiFe layer is fixed in the range of several tens to several hundreds Oe in magnetic field intensity. On the other hand, the direction of the magnetic spin of the other NiFe layer is freely varied by an external magnetic field. As a result, there can be achieved a magnetoresistance change rate (MR ratio) in a small range of 2 to 5%, which corresponds to the degree of coercive force of the NiFe layer. In addition, the following papers have been published.

a. Physical Review B, 43(1991)1297

Si/Ta(50)/NiFe(60)/Cu(20)/NiFe(45)/FeMn(70)/Ta(50) [parenthesis represents film thickness (Å) of each layer] is reported to exhibit that its MR ratio sharply rises up to 5.0% at an applied external magnetic field of 10 Oe.

b. Journal of Magnetism and Magnetic Materials, 93(1991) 101

Si/Ta(50)/NiFe(60)/Cu(25)/NiFe(40)/FeMn(50)/Cu(50) is reported to exhibit that its MR ratio sharply rises up from 0 to 4.1% at an applied external magnetic field of 0 to 15 Oe.

c. Physical Review B, 45(1992)806

The temperature characteristics and MR characteristics when the magnetic layer thickness is varied and Co, NiFeNi, etc. are used as the magnetic layer are analyzed on the basis of the results of the above papers a and b.

d. Japanese Journal of Applied Physics, 32(1993)L1441

The MR ratio is reported when the multilayer structure is adopted in the above papers a and b. In this multilayer structure, the structure of NiFe(60)/Cu(25)/NiFe(40)FeMn (50) is laminated so as to sandwich Cu therebetween.

Furthermore, the following publications are made public.

e. Japanese Laid-open Patent Application No. Hei-2-61572 (U.S. Pat. No. 4,949,039)

It is described that a large MR effect can be obtained by forming ferromagnetic thin films through a non-magnetic intermediate layer so as to be arranged in anti-parallel to each other. In addition, it describes a structure in which antiferromagnetic material is disposed adjacently to one of the ferromagnetic layers.

f. Japanese Laid-open Patent Application Hei-5-347013

A magnetic recording and reproducing device using a spin valve film is described. Particularly, it is disclosed that nickel oxide is used for an antiferromagnetic film.

In such a spin valve magnetic multilayer film, the MR ratio is lower than the structure of Fe/Cr, Co/Cu, Co/Ag or the like , however, the MR curve varies sharply at an applied magnetic field below several tens Oe, so that it is suitably usable as MR head material for a recording density higher than 1 to 10 Gbit/inch$^2$. However, these papers and publications merely disclose the basic action of the spin valve film.

$Ni_{0.8}Fe_{0.2}$ (Permalloy) is mainly used as the MR head material for actual ultrahigh density magnetic recording at present. This material converts the change of a signal magnetic field from a magnetic recording medium into the change of electrical resistance by utilizing an anisotropic magnetoresistance effect. The MR ratio is in the range of 1 to 3% at most. In this case, the magnetoresistance change has a characteristic which is symmetrical at increasing and decreasing sides of magnetic field with the magnetic field of zero at the center.

As a means of solving this characteristic, in case of NiFe, etc., a shunt layer of Ti or the like which has a low resistivity is provided to shift an operating point. Furthermore, in addition to the shunt layer, a soft film bias layer which is formed of soft magnetic material having a large resistivity such as CoZrMo, NiFeRh or the like is also provided to apply a bias magnetic field. However, the structure having such a bias layer complicates its manufacturing process, and makes it difficult to stabilize its characteristics, resulting in cost-up. Furthermore, in this case, a gently-sloping portion of an MR change curve which is caused by the shift of the MR curve is used, and thus the MR slope per unit magnetic field is reduced to a small value of about 0.05%/Oe, resulting in reduction of S/N. Therefore, this value is insufficient as the MR head material for the recording density higher than 1 to 10 Gbit/inch$^2$.

Furthermore, in case of MR heads, etc., there are some cases where a laminate structure is complicated, and thermal treatments such as baking, curing, etc. of resist materials are required in a patterning process, a flattening process, etc., so that heat resistance against a temperature of about 300° C. is required for MR materials. However, such a thermal treatment deteriorates the characteristics of the conventional artificial superlattice structure.

With respect to the conventional spin valve film as disclosed in the papers, etc., only the basic structure and basic characteristics thereof as a thin film are argued, and any MR head structure to realize the ultrahigh density recording and any magnetic multilayer structure suitable therefor are not described.

As described above, in the examples as described in these papers, when the thin films as described in these papers are applied as an MR head, the MR slope is small in an actual magnetic field detection range, and thus an excellent and stable reproduced output cannot be obtained by the MR head. Furthermore, an MR change curve at an applied magnetic field of −10 to 10 Oe is important as a more excellent MR head material in the ultrahigh density magnetic recording. However, any of these papers has no argument on the details of the MR slope in this range.

Furthermore, a high-density recording and reproducing MR head is required to be used under high-frequency magnetic field above 1 MHz. However, in the film-thickness structure of each type conventional three-element magnetic multilayer, it is difficult to set above 0.2%/Oe of the slope (MR slope at a high frequency) of a magnetoresistance change curve at a width of 10 Oe in the high frequency magnetic field range above 1 MHz to obtain high sensitivity at high frequencies.

SUMMARY OF THE INVENTION

The present invention has been achieved in view of the above situation, and its object is to provide a magnetoresistance effect element with a magnetic multilayer film having a high heat-resistance, which has a high MR ratio, characteristic of exhibiting linear rise-up of MR change in an extremely small magnetic-field range of about −10 to 10 Oe, high sensitivity to magnetic field and a large MR slope under a high-frequency magnetic field, and also to provide a magnetoresistance device having the magnetoresistance effect element, such as a magnetoresistance effect type head or the like.

A magnetoresistance effect element according to the present invention comprises a non-magnetic metal layer, a ferromagnetic layer formed on one surface of the mon-magnetic metal layer, a soft magnetic layer formed on the other surface of the non-magnetic metal layer, and a pinning layer which is formed on the ferromagnetic layer to pin the direction of magnetization of the ferromagnetic layer, wherein the ferromagnetic layer and the pinning layer are coupled to each other by epitaxial growth.

A magnetoresistance effect element according to the present invention has a magnetic multilayer film having a magnetic multilayer film unit in which a pinning layer for pinning the direction of magnetization of ferromagnetic layers adjacent thereto is provided, and a pair of ferromagnetic layers, a pair of non-magnetic metal layers and a pair of soft magnetic layers are successively laminated at both sides of the pinning layer in this order, wherein the ferromagnetic layers and the pinning layer are coupled to each other by epitaxial growth.

A magnetoresistance device according to the present invention comprises a magnetoresistance effect element, conductive films and electrode portions, wherein the conductive films are conducted to the magnetoresistance effect element through the electrode portions, and the magnetoresistance effect element comprises a non-magnetic metal layer, a ferromagnetic layer formed on one surface of the non-magnetic metal layer, a soft magnetic layer formed on the other surface of the non-magnetic metal layer, and a pinning layer which is formed on the ferromagnetic layer to pin the direction of magnetization of the ferromagnetic layer, wherein the ferromagnetic layer and the pinning layer are coupled to each other by epitaxial growth.

A magnetoresistance device according to the present invention comprises a magnetoresistance effect element, conductive films and electrode portions, wherein the conductive films conducted to the magnetoresistance effect element through the electrode portions, the magnetoresistance effect element has a magnetic multilayer film having a magnetic multilayer film unit in which a pinning layer for pinning the direction of magnetization of ferromagnetic layers adjacent thereto is provided, and a pair of ferromagnetic layers, a pair of non-magnetic metal layers and a pair of soft magnetic layers are successively laminated at both sides of the pinning layer in this order, and the ferromagnetic layers and the pinning layer are coupled to each other by epitaxial growth.

According to the present invention on the first magnetoresistance effect element, multilayer films having the magnetoresistance ratio whose MR slope is above 0.3%/Oe can be obtained. In addition, the rise-up characteristic of the MR curve under zero magnetic field is extremely excellent, and has a high heat resistant property. According to the present invention on the second magnetoresistance effect element, the MR slope further has a higher value above 0.3%/Oe and a low resistivity. In addition, there can be obtained a magnetic multilayer film having high heat resistance in which no deterioration occurs in its characteristics even when a thermal treatment at a temperature before and after 350° C. is conducted under a pressure of $10^{-7}$ Torr or less. According to the present invention on the first magnetoresistance device having the first magnetoresistance effect element, an output voltage which is approximately three times as high as that of the conventional materials can be obtained. Furthermore, according to the second magnetoresistance device having the second magnetoresistance effect element, the MR slope in a high-frequency region has a high value of 0.3%/Oe or more and a low resistivity. In addition, a calorific value due to measurement current is small, and an output voltage of 3.8 times can be obtained. Accordingly, there can be provided an excellent magnetoresistance device such as an MR head which has extremely high reliability, and can perform an ultrahigh density magnetic recording operation whose recording density exceeds 1 Gbit/inch$^2$.

BRIEF DESCRIPTION OF THE DRAWINGS

FIGS. 10(A), (C) are graphs showing the magnetization curves just after the film formation and after the heat treatment of the magnetoresistance effect element (magnetic multilayer film) of the first invention, and FIGS. 10(B) (D) are graphs showing the MR curves just after the film formation and after the heat treatment of the magnetoresistance effect element (magnetic multilayer film) of the first invention;

FIGS. 11(A), (C) are graphs showing the magnetization curves just after the film formation and after the heat treatment of the magnetoresistance effect element (magnetic multilayer film) of the second invention, and FIGS. 11(B), (D) are graphs showing the MR curves just after the film formation and after the heat treatment of the magnetoresistance effect element (magnetic multilayer film) of the second invention;

DETAILED DESCRIPTION OF THE INVENTION

The embodiments according to the present invention will be described in detail.

Figure 1:
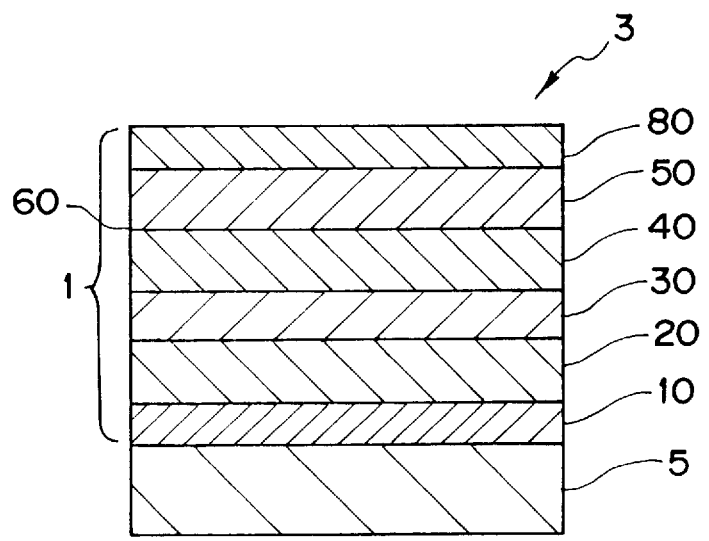
FIG. 1 is a cross-sectional view showing a magnetoresistance effect element according to a first invention.

FIG. 1 is a cross-sectional view showing a magnetoresistance effect element 3 of a first embodiment according to the present invention. The magnetoresistance effect element 3 has an artificial superlattice magnetic multilayer film 1 (hereinafter merely referred to as first magnetic multilayer film or magnetic multilayer film 1). In FIG. 1, the magnetic multilayer film 1 has a laminate body structure which comprises a non-magnetic metal layer 30, a ferromagnetic layer 40 formed on one surface of the non-magnetic metal layer 30, a soft magnetic layer 20 formed on the other surface of the non-magnetic metal layer 30, and a pinning layer 50 which is formed on the ferromagnetic layer 40 to pin the direction of magnetization of the ferromagnetic layer 40.

The laminate body structure is usually formed on a substrate 5 as shown in FIG. 1, and a metal undercoat layer 10 is interposed between the substrate 5 and the soft magnetic layer 20. Further, a protection layer 80 is formed on the pinning layer 50 as shown in FIG. 1.

In this invention, it is required that the soft magnetic layer 20 and the ferromagnetic layer 40 which are formed at both sides of the non-magnetic metal layer 30 so as to be adjacent to the non-magnetic metal layer 30 have substantially different magnetization directions from each other in accordance with a signal magnetic field applied from the external. The reason is as follows. In the principle of the present invention, when the magnetization directions of the soft magnetic layer 20 and the ferromagnetic layer 40 which are formed through the non-magnetic metal layer 30 are deviated from each other, conduction electrons have a behavior of scattering due to spins to increase its resistance. In this case, when the magnetization directions are opposite to each other, the maximum resistance is obtained. That is, in this invention, when a signal magnetic field from the external is positive (in a upward direction with respect to the recording surface 93 of a recording medium 90 (represented by reference numeral 92)) as shown in FIG. 2, there occurs components in the neighboring magnetic layers whose magnetization directions are opposite to each other, so that the resistance is increased.

Here, the relationship among the external signal magnetic field from a magnetic recording medium, magnetization directions of the soft magnetic layer 20 and the ferromagnetic layer 40 and the variation of electrical resistance will be described.

Figure 2:
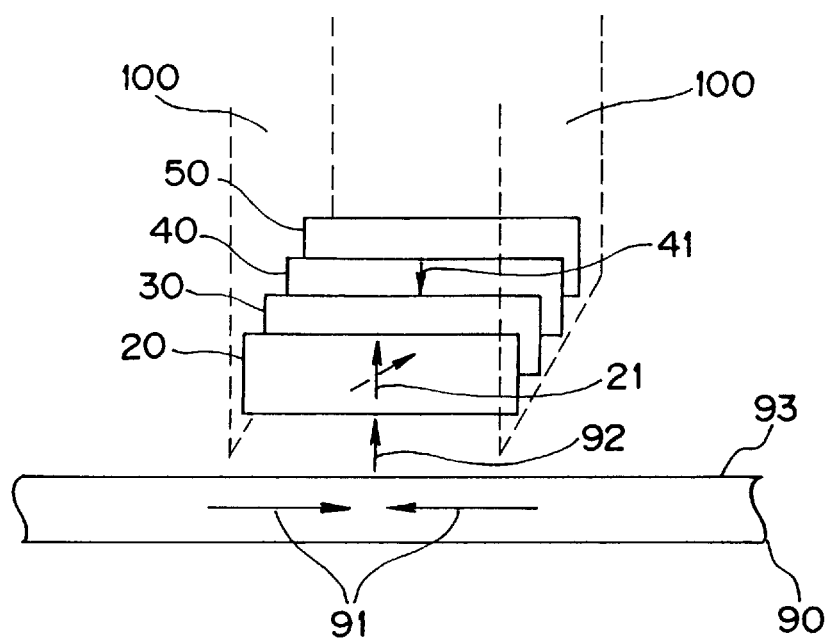
FIG. 2 is a schematic diagram showing a magnetoresistance effect element to explain the action of the invention, and particularly showing the structure of a magnetic multilayer film.

Now, in order to facilitate the understanding of the present invention, a simplest magnetic multilayer film I in which a pair of a soft magnetic layer 20 and a ferromagnetic layer 40 exist through a non-magnetic metal layer 30 as shown in FIG. 2 will be described with reference to FIG. 2.

As shown in FIG. 2, the magnetization of the ferromagnetic layer 40 is pinned in a downward direction to the surface of the recording medium by a method as described later (reference numeral 41). The soft magnetic layer 20 is formed through the non-magnetic metal layer 30, so that the magnetization direction thereof is varied in accordance with the signal magnetic field from the external (reference numeral 21). At this time, the relative angle between the magnetization directions of the soft magnetic layer 20 and the ferromagnetic layer 40 is greatly varied in accordance with the direction of the signal magnetic field from the magnetic recording medium 90. As a result, the scattering degree of the conduction electrons flowing in the magnetic layers is varied, and thus the electrical resistance is greatly varied.

Accordingly, a large MR (Magneto-Resistive) effect, which is substantially different in mechanism from the anisotropic magnetoresistance effect of ordinary permalloy, can be obtained.

Figure 3A:
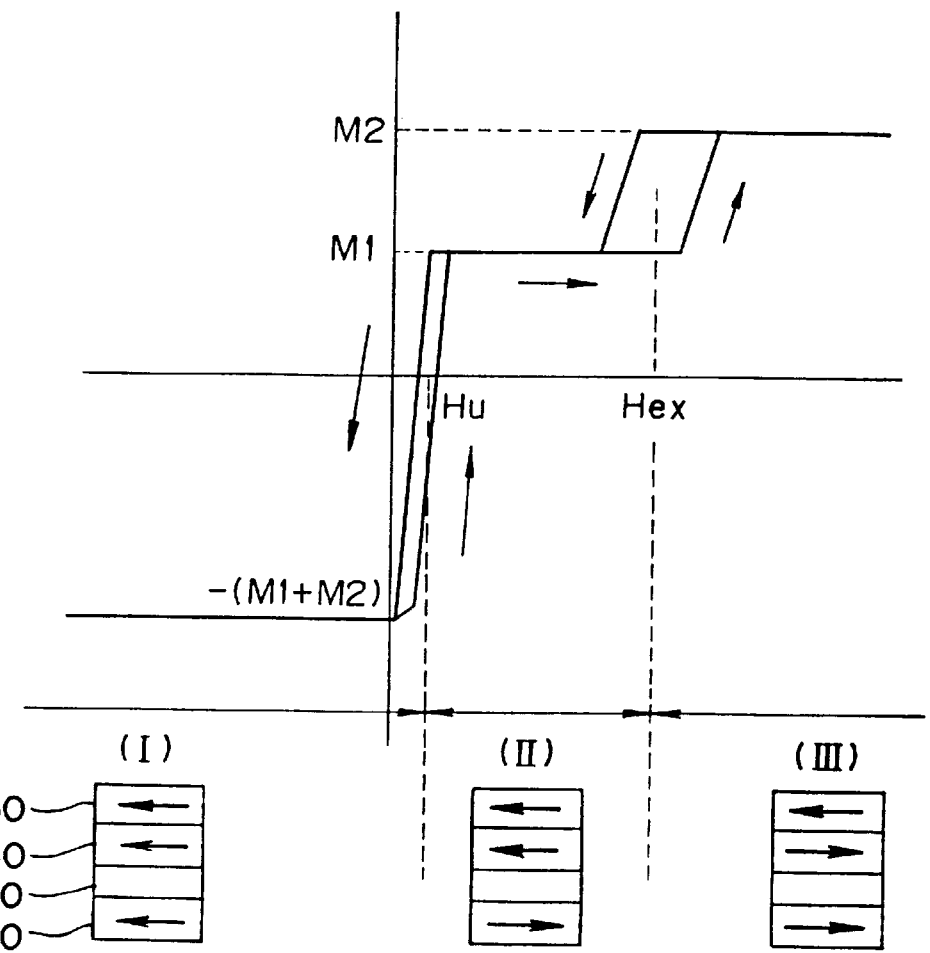
FIGS. 3A and 3B are schematic diagrams showing a magnetization curve and an MR curve to explain the action of the present invention.
Figure 3B:
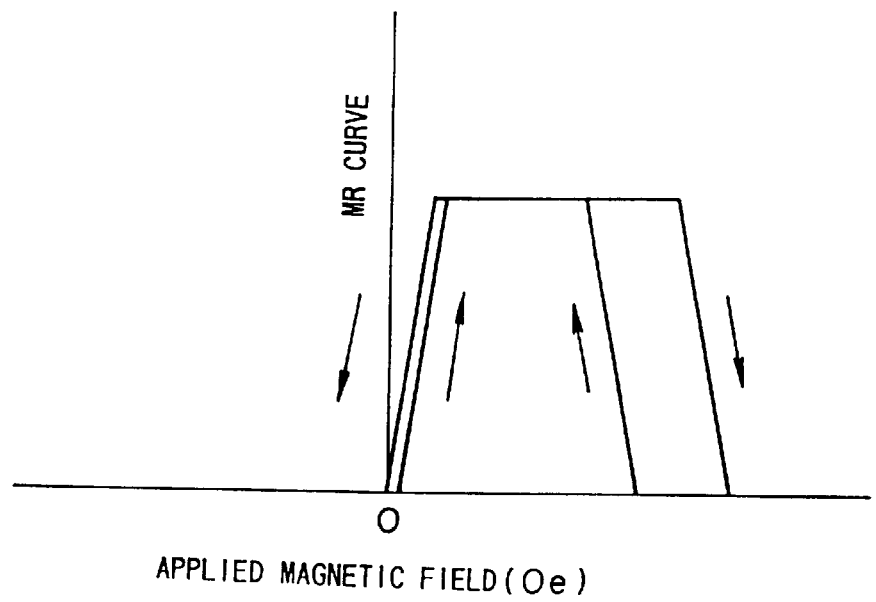

The magnetization directions of the soft magnetic layer 20, the ferromagnetic layer 40 and the pinning layer 50 exhibiting a pinning effect are varied relatively to the external magnetic field. The variation of the magnetization directions thereof is shown in FIG. 3 in correspondence with the magnetization curve and the MR curve. In this case, all the magnetization of the ferromagnetic layer 40 is fixed in a minus direction (in a downward direction with respect to the recording surface of the recording medium 90). When the external signal magnetic field is minus, the magnetization of the soft magnetic layer 20 is in the minus direction. Now, it is assumed that the coercive force of each of the soft magnetic layer 20 and the ferromagnetic layer 40 is approximate to zero in order to simplify the description. In an area (I) where the signal magnetic field H<0, the magnetization of both the soft magnetic layer 20 and the ferromagnetic layer 40 is in a fixed direction. However, when the external magnetic field is intensified and H exceeds the coercive force of the soft magnetic layer 20, the magnetization direction of the soft magnetic layer is rotated in the direction of the signal magnetic field, so that the magnetization and the electrical resistance are increased as the magnetization directions of the soft magnetic layer 20 and the ferromagnetic layer 40 are opposite to each other. Finally, these values are fixed (the state of an area (II)). At this time, a pinning magnetic field Hex is applied by the pinning layer 50. If the signal magnetic field exceeds Hex, the magnetization of the ferromagnetic layer 40 is also rotated in the direction of the signal magnetic field, so that the magnetization of each of the soft magnetic layer 20 and the ferromagnetic layer 40 is oriented in the same fixed direction in an area (III). At this time, the magnetization is set to a constant value, and the MR curve is equal to zero.

Conversely, when the signal magnetic field H is reduced, the magnetization is changed from the area (III) through the area (II) to the area (I) by inversion of the magnetization of the soft magnetic layer 20 and the ferromagnetic layer 40 in the same manner as described above. At an initial portion of the area (II), conduction electrons have a behavior of scattering dependently on spins, and the resistance is increased. In the area (II), there ferromagnetic layer 40 has little magnetization inversion because it is pinned, however, the magnetization of the soft magnetic layer 20 increases linearly, so that the rate of spin-dependently scattered conduction electrodes is gradually increased in accordance with the magnetization change of the soft magnetic layer 20. That is, if $Ni_{0.8}Fe_{0.2}$ whose Hc is low is selected for the soft magnetic layer 20 and a suitable anisotropic magnetic field Hk is applied, a formed magnetic multilayer film has a linearly-varying resistance and a large magnetoresistance ratio in a small external magnetic field of several Oe to several tens Oe below Hk.

In this invention, the thickness of each thin film layer is set to an individual limit value. If the thickness of the non-magnetic metal layer is larger than the limit value, the rate of the conduction electrodes flowing through only this layer increases, so that the total MR change becomes small unfavorably. On the other hand, the conduction electrodes are scattered at the interface portions between the non-magnetic metal layer and each of the soft magnetic layer 20 and the ferromagnetic layer 40, so that the effect is not substantially improved even if the thickness of the two magnetic layers 20, 40 is larger than 10 Å. Rather, it is unfavorable because the total film thickness is increased. The lower limit of the thickness of the two magnetic layers 20 and 40 is preferably set to 20 Å or more. If the thickness is smaller than this value, heat resistance and resistance against processing are deteriorated.

Each construction of the first magnetic multilayer film as described above will be described hereunder in detail.

This multilayer film is first characterized in that the ferromagnetic layer 40 and the pinning layer 50 are laminated on each other epitaxially (epitaxy). That is, the ferromagnetic layer 40 and the pinning layer 50 as described above are formed so as to be coupled to each other by epitaxial growth.

The epitaxy is a word which expresses a phenomenon on crystal growth between layers. In this invention, respective atoms of both the pinning layer 50 and the ferromagnetic layer 40 which is formed to be adjacent to the pinning layer 50 are aligned with one another to some extent on a crystal orientation face, and also these layers are formed in a crystallographic relationship with each other. In this invention, the magnetic multilayer film thus formed is cut out in a laminate direction, and the laminate section is observed with a high-resolution transmission electron microscope (TEM). The inside of the ferromagnetic layer 40 and the inside of the pinning layer 50 are observed. If any crystal lattice fringe is observed, the crystal orientation of the layer is found out to be aligned, and the orientation face(or plane) is identified on the basis of the interval thereof. Next, the interface portion between the pinning layer 50 and the ferromagnetic layer 40 is observed in detail. If the interference fringes of the respective layers are connected to each other at the interface portion, these layers are judged to be in an epitaxy relationship with each other.

As described above, according to the present invention, it is an important requirement that the ferromagnetic layer 40 and the pinning layer 50 are coupled to each other by epitaxial growth. If these layers 40 and 50 are not formed by the epitaxial growth, the pinning effect of the ferromagnetic layer 40 by the pinning layer 50 is reduced, and thus no relative angle occurs between the spins of the soft magnetic layer 20 and the ferromagnetic layer 40, so that there occurs a disadvantage that no large electrical resistance change occurs.

The ferromagnetic layer 40 is formed of metal element such as Fe, Ni, Co, Mn, Cr, Dy, Er, Nd, Tb, Tm, Ce, Gd or the like, alloy or compound containing the above metal element, or the like. Particularly, it is preferably formed of a composition expressed by $(Co_zNi_{1-z})_wFe_{1-w}$ ($0.4 \leq z \leq 1.0$, $0.5 \leq w \leq 1.0$ by weight). Out of the composition range as described above, no large electrical resistance change can be obtained.

The thickness of the ferromagnetic layer as described above is set to 20 to 100 Å, and more preferably 20 to 60 Å. If this value is smaller than 20 Å, it loses the characteristic as the ferromagnetic layer. On the other hand, if the value exceeds 100 Å, the pinning force of the pinning layer 50 is reduced, and thus the sufficient spinning effect of the spin of the ferromagnetic layer cannot be obtained.

Any material may be used as the pinning layer 50 insofar as it fixes the magnetization of the ferromagnetic layer to which the pinning layer is substantially adjacent. Particularly, it is be selected from an antiferromagnetic layer, a hard magnetic layer, a pinning ferromagnetic layer which is formed of material different from the ferromagnetic layer 40 connected to the pinning layer, and a layer into which artificial structural defects are introduced.

The antiferromagnetic layer may contain at least two kinds of Fe, Ni, Co, Cr, Mm, Ru, Rh, Mo, O. For example, it is preferably selected from FeMn, FeMnPt, FeMnRu, FeMnRh, FeMnMo,FeNiO, CoNiO, CrMn, CrMnO, $Fe_2O_3$, NiO, etc.

As the hard magnetic layer is preferably selected material which is formed of one kind of metal selected from Fe, Co and Ni,or contains 50 at % or more of one kind of metal selected from Fe, Co and Ni. For example, FeNi, CoNi, FeTb, CoPt, CoFePt or the like is preferable.

As the ferromagnetic layer formed of different material is used Fe, Ni, Co, Mn, Cr, Dy, Er, Nd, Tb, Tm, Ce, Gd or the like, or alloy or compound which contains these elements. For example, it is preferably formed of FeSi, FeNi, FeCo, FeAl, FeAlSi, FeY, FeGd, FeMn, CoNi, CrSb, Fe-based amorphous alloy, Co-based amorphous alloy, MnSb, NiMn, ferrite or the like.

The same pinning effect can be obtained by introducing artificial structural defects into the interface portion of the ferromagnetic layer 40 which faces the pinning layer 50. In this case, after the ferromagnetic layer 40 is formed, the surface of the ferromagnetic layer 40 at a thickness of about 2 to 20 Å is etched by weak ion beams at an ion current of 10 to 50 mA and at an acceleration voltage of about 100 to 500 eV. At this time, the magnetization of the ferromagnetic layer 40 is pinned by the introduced structural defects at the interface portion, and the same effects as the other methods can be obtained.

With this method, since the ferromagnetic layer 40 and the pinning layer 50 which are adjacent to each other are substantially directly contacted with each other, a direct interlayer interaction acts on each other, and the rotation of the magnetization of the ferromagnetic layer 40 is prevented. On the other hand, with respect to the soft magnetic layer 20 as described in detail later, its magnetization can freely rotated by a signal magnetic field from the outside. As a result, a relative angle between both the soft magnetic layer 20 and the ferromagnetic layer 40 is produced, so that a large MR effect due to the difference between the magnetization directions can be obtained.

The thickness of the pinning layer 50 is preferably set to 50 to 700 Å. If the thickness is smaller than 50 Å, the crystallinity of the pinning layer is lowered, and the sufficient pinning effect cannot be obtained, so that the large MR effect cannot be obtained. If the thickness exceeds 700 Å, the total thickness of the magnetic multilayer film is excessively large, and thus the total resistance of the film is large, so that the MR ratio is reduced. In addition, the thickness of the shield layer is larger, and thus the multilayer film thus formed is unsuitable for the ultrahigh magnetic recording.

The soft magnetic layer 20 is formed of Fe, Ni, Co or the like, or alloy or compound containing these elements. The MR curve rises up more sharply by using the magnetic layer having small coercive force Hc, and a favorable effect can be obtained. Particularly, a composition as expressed by $(Ni_xFe_{1-x})_yCo_{1-y}$ ($0.7 \leq x \leq 0.9$, $0.5 \leq y \leq 1.0$ by weight) is preferable. Here, if x, y are within these ranges, Hc becomes small and excellent soft magnetic characteristics can be obtained, so that an excellent MR characteristic having high magnetic field sensitivity can be obtained. On the other hand, if x, y are out of these ranges, Hc becomes large, so that no MR characteristic having high magnetic field can be obtained unfavorably.

Furthermore, as the composition of the soft magnetic layer 20, the composition as expressed by $Co_tM_uM'_qB_r$ ($0.6 \leq t \leq 0.95$, $0.01 \leq u \leq 0.2$, $0.01 \leq q \leq 0.1$, $0.05 \leq r \leq 0.3$ by atomic ratio) also exhibits an excellent characteristic. Here, M comprises at least one kind selected from Fe and Ni, and M' comprises at least one kind selected from Zr, Si, Mo and Nb. When M and M' comprises at least two kinds of materials, the total amount of at least the two kinds are set to be within the above composition range. Such a composition contains a large amount of Co, so that it has an extremely excellent advantage that the MR ratio is larger than the composition as described above. Furthermore, it has a crystal structure in which ultrafine crystal particles are assembled or an amorphous structure, and thus it exhibits an excellent soft magnetic characteristic, so that the large MR slope can be obtained. As a specific composition, Co is contained as a main component and the amount of Ni and/or Fe is set so that magnetostriction is equal to zero. Further, Zr, Si, Mo, Nb or the like is added to this composition to stabilize the amorphous composition. If the composition ratio of Co is lower than 0.6, no amorphous state can be obtained. The composition ratio of Co may exceed 0.95, and a small amount of Fe or Ni is preferably added because an excellent characteristic as the soft magnetic material can be obtained. The composition ratio of M' is set to $0.01 \leq q \leq 0.1$, and no effect of the addition of M' can be obtained if q is lower than 0.01. If q exceeds 0.1, the characteristic as the soft magnetic material is deteriorated. B (boron) is the main element to make amorphous, and its composition ratio is set to $0.05 \leq r \leq 0.3$. If r is lower than 0.05, no effect of the addition of B can be obtained. If r exceeds 0.3, the characteristic as the soft magnetic material is deteriorated.

The thickness of the soft magnetic layer 20 as described above is set to 20 to 100 Å, preferably 40 to 100 Å, and more preferably 50 to 80 Å. If this value is smaller than 20 Å, no excellent characteristic as the soft magnetic layer can be obtained. On the other hand, if the value exceeds 100 Å, the total thickness of the multilayer film is large and the resistance of the whole magnetic multilayer film is increased, so that the MR effect is reduced.

In order to conduct electrons efficiently, a metal having conductivity is preferably used for the non-magnetic metal layer which is interposed between the soft magnetic layer 20 and the ferromagnetic layer 40. More specifically, it may formed of at least one kind selected from Au, Ag and Cu, alloy containing 60 wt% or more of at least one of these elements, or the like.

The thickness of the mon-magnetic metal layer 30 is preferably set to 20 to 60 Å. If this value is smaller than 20 Å, the soft magnetic layer 20 and the ferromagnetic layer 40 which are disposed through the non-magnetic metal layer are exchange-coupled to each other, so that the spins of the soft magnetic layer 20 and the ferromagnetic layer 40 do not function independently of each other. If this value exceeds 60 Å, the rate of the electrons which are scattered at the interface between the soft magnetic layer 20 and the ferromagnetic layer 40 disposed at the upper and lower sides respectively are reduced, so that the MR ratio is reduced.

Furthermore, in the relationship among the pinning layer 50, the ferromagnetic layer 40 and the soft magnetic layer 20, it is preferable that the following resistivity relationship satisfies the following equation (1), where the resistivity of the pinning layer 50 is represented by $\rho_p$; the resistivity of the ferromagnetic layer 40, $\rho_f$; and the resistivity of the soft magnetic layer 20, $\rho_s$:

$$3((\rho_f+\rho_s)/2) < \rho_p < 30((\rho_f+\rho_s)/2) \qquad \text{equation(1)}$$

If the value $\rho_p$ is below the lower limit of the equation (1), there occurs a disadvantage that the paths of electrons cannot be effectively separated. If the value $\rho_p$ is above the upper limit of the equation (1), a manufacturing method is extremely difficult.

The metal undercoat layer 10 is not limited to a specific one, however, preferably it has the same crystal structure as the used non-magnetic metal layer 30. That is, Ta, Hf, Cu, Au, Ag, Nb or Zr which has face-centered cubic lattice (fcc), alloy of these metals or the like can be used for the metal undercoat layer 10. The metal undercoat layer 10 is formed to improve the crystal orientation of the whole magnetic multilayer film. The thickness thereof is set to about 30 to 300 Å.

The protection layer 80 is formed to prevent oxidation of the surface of the magnetic multilayer film in a film-forming process and improve wettability with electrode material formed thereon and adhesive strength. The protection layer 80 is formed of Ti, Ta, W, Cr, Hf, Zr, Zn or the like. The thickness thereof is generally set to about 30 to 300 Å.

The substrate 5 is formed of glass, silicon, MgO, GaAs, ferrite, AlTiC, $CaTiO_3$ or the like, and the thickness thereof is generally set to about 0.5 to 10 mm.

Figure 4:
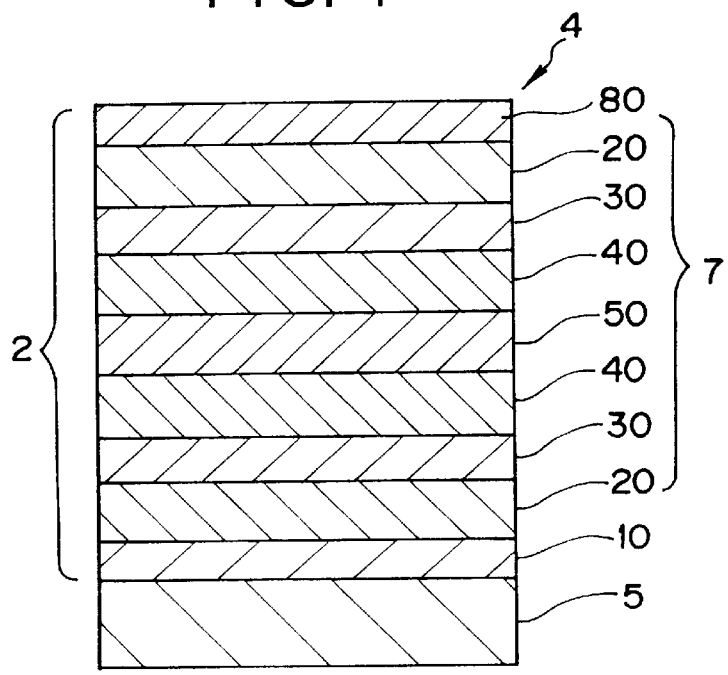
FIG. 4 is a cross-sectional view showing a magnetoresistance effect element according to a second invention.

Next, a magnetoresistance effect element of a second embodiment according to the present invention, that is, a magnetoresistance effect element 4 having a magnetic multilayer film as shown in FIG. 4 (hereinafter merely referred to as a second magnetic multilayer film or magnetic multilayer film 2) will be described.

The magnetic multilayer film 2 of the magnetoresistance effect element 4 of the second embodiment has a magnetic multilayer unit comprising a pair of ferromagnetic layers 40, a pair of non-magnetic metal layers 30 and a pair of soft magnetic layers 20 which are successively disposed at both sides of a pinning layer 50 as shown in FIG. 4. In this embodiment, the unit 7 is formed on a substrate 5 through a metal undercoat layer 10 as shown in FIG. 4. Further, the protection layer 80 is formed on the soft magnetic layer 20 at the upper side as shown in FIG. 4. A non-magnetic metal layer may be formed between the metal undercoat layer 10 and the soft magnetic layer 20. In FIG. 4, the same reference numerals as used for the description of the magnetic multilayer film 1 (FIG. 1) represent the same members as those of the magnetic multilayer film 1 as described above, and they have the same basic actions.

The inventors has made further progress in their studies on the construction of the magnetic multilayer film 1 (FIG. 1) having the magnetoresistance effect element 3 of the first embodiment as described above, and through these studies, they have found out that the construction of a magnetic multilayer film 2 as shown in FIG. 4 is particularly preferable to obtain a large MR effect.

That is, the pinning layer 50 has a magnetic spin structure which is substantially fixed in a direction against an external magnetic field. The magnitude of the spin is not varied by the external signal magnetic field. On the other hand, the magnetic multilayer film of the present invention exhibits great magnetoresistance change by changing the direction of the spin of the soft magnetic layer 20 relatively to the signal magnetic field. Accordingly, in order to increase the magnetoresistance, the number of the soft magnetic layers 20 whose spins are freely rotated is set to be higher than the number of pinning layers 50. That is, as shown in FIG. 4, the ferromagnetic layers 40, 40, the non-magnetic metal layers 30, 30 and the soft magnetic layers 20, 20 may be formed at both sides of the pinning layer 50 with the pinning layer 50 at the center of the multilayer film as shown in FIG. 4 to form the magnetic multilayer film 2 (magnetoresistance effect element 4) having a greatly-improved magnetoresistance effect.

It is preferable that the ferromagnetic layers 40, the non-magnetic metals 30, the soft magnetic layers 20 and the pinning layer 50 are formed of the same materials as the first embodiment and at the same thickness as the first embodiment. The same is also applied to the protection layer 80, the metal undercoat layer 10 and the substrate 5. In the magnetic multilayer film 2 as described above, the pinning layer 50 and the pair of ferromagnetic layers 40 which are formed at both sides of the pinning layer 50 are required to be coupled to each other by the epitaxial growth.

The spins of both the ferromagnetic layers 40, 40 and the soft magnetic layers 20, 20 contribute to the scattering of the conduction electrons. When both the spins have substantially the same magnitude, the electrons are scattered most efficiently. That is, it is best that the magnetization amount of each layer is set to substantially the same value. However, in the case of the magnetic multilayer film 2 of the second embodiment, The ferromagnetic layers 40, 40 are designed to be formed at both sides of the pinning layer 50. Accordingly, considering only one ferromagnetic layer 40, the scattering is performed with higher efficiency by setting the magnetization of the ferromagnetic layer 40 to be smaller than the magnetization of the soft magnetization layer 20. If the ferromagnetic layer 40 has an excessively large thickness, the magnetization of the whole layer 40 becomes larger than the magnetization of the soft magnetic layer 20, so that the thickness of the ferromagnetic layer 40 is set to such a value that both the layers have substantially the same magnetization. Specifically, if the thickness of each of the layers 20 and 40 is set to satisfy the following equation:

$$0.3 \text{ Ms} \leq \text{Mf} 0.8 \text{ Ms, preferably } 0.4 \text{ Ms} \leq \text{Mf} \leq 0.7 \text{ Ms},$$

where the magnetization of the ferromagnetic layer 40 is represented by Mf and the magnetization of the soft magnetic layer 20 is represented by Ms, the relationship between the thickness of each layer and the scattering efficiency has the best balance.

The material of each layer and the thickness thereof are specified as described above, and an external magnetic field is applied in a direction within the film surface as described later at the film formation time of at least the soft magnetic layer 20 to apply anisotropic magnetic field Hk of 3 to 20 Oe, preferably 3 to 16 Oe, and more preferably 3 to 12 Oe. With this operation, the magnetic multilayer film 2 (magnetoresistance effect element 4) thus formed has an MR change curve in which the MR slope at a rise-up portion is equal to 0.3%/Oe or more, particularly 0.4%/Oe or more, usually 0.4 to 1.0%/Oe. The maximum hysteresis width of the MR change curve is equal to 8 Oe or less, usually 0 to 6 Oe. Furthermore, the MR slope under the high-frequency magnetic field of 1 MHz can be set to 0.2%/Oe or more, more preferably 0.25%/Oe or more, usually 0.3 to 1.0%/Oe. Accordingly, when it is used for a reading MR head or the like for the high-density recording, a sufficient performance can be obtained. In the magnetic multilayer film 1 of the first embodiment (magnetoresistance effect element 3), it is better to conduct the same treatment on the soft magnetic layer 20. If the anisotropic magnetic field Hk of the soft magnetic layer is lower than 3 Oe, it is equal to the same degree of the coercive force, and no linear MR change curve can be substantially obtained in the vicinity of zero magnetic field, so that the characteristic as the MR element is deteriorated. On the other hand, If it is higher than 20 Oe, the MR slope becomes small and when this film is applied to the MR head or the like, the output is liable to be reduced and the resolution is reduced. The value ilk as described above can be obtained by applying the external magnetic field of 10 to 300 Oe at the film formation, If the external magnetic field is below 10 Oe, it is too insufficient to induce Hk. On the other hand, if it exceeds 300 Oe, the effect is not improved although a coil must be designed in a large size due to occurrence of magnetic field. Therefore, the cost is increased and thus it is inefficient.

When the maximum resistivity is represented by $\rho_{max}$ and the minimum resistivity is represented by $\rho_{sat}$, the MR ratio is represented as $(\rho_{max}-\rho_{sat})\times100/\rho_{sat}$ (%). The maximum hysteresis width corresponds to the maximum value of the hysteresis width which is calculated by measuring the magnetoresistance change curve (MR curve). The MR slope corresponds to the maximum value of differential values at −20 to +20 Oe which is obtained by measuring the MR curve and calculating a differential curve. The high-frequency MR slope corresponds to an MR slope which is obtained by measuring the MR ratio under an alternating current magnetic field of 6 Oe magnetic width at 1 MHz.

Each of the magnetic multilayer film 1 of the first embodiment and the magnetic multilayer film 2 of the second embodiment may be repetitively laminated to form a magnetoresistance effect element. In this case, the repetitive lamination frequency N of the magnetic multilayer film is not limited to a specific one, and it may be suitably selected in accordance with a desired magnetoresistance ratio, etc. In order to satisfy a present requirement for ultrahigh densification of the magnetic recording, the total film thickness of the magnetic multilayer film is better to be smaller. However, if the film is thinner, the MR effect is usually reduced. The magnetic multilayer film of this invention is sufficiently practically used, even when the repetitive lamination frequency is equal to 1. Furthermore, as the lamination frequency is heightened, the magnetoresistance ratio increases, however, productivity is lowered. If N is excessively large, the resistance of the whole element is excessively low, and it is practically inconvenient. Therefore, usually, N is preferably set to 10 or less. The long-period structure of superlattices can be confirmed on the basis of appearance of primary and secondary peaks in accordance with a repetitive period in a small-angle X-ray diffraction pattern. When it is applied to a magnetoresistance device such as an MR head or the like for ultrahigh density magnetic recording, N is preferably set to 1 to 5.

The film formation of each layer of the magnetic multilayers 1 and 2 as described above may be performed by a ion-beam sputtering method, a sputtering method, a deposition method, a molecular beam epitaxy (MBE) method or the like. As the substrate 5, glass, silicon, MgO, GaAs, ferrite, AlTiC, CaTiO$_3$ or the like, may be used . For the film formation, it is preferable that an external magnetic field of 10 to 300 Oe is applied in a direction within the film plane at the film formation of the soft magnetic layer 20. With this operation, Hk can be provided to the soft magnetic layer 20. The application of the external magnetic field may be performed at only the film formation time of the soft magnetic field, for example, using a device which is equipped with electromagnet or the like which is capable of easily controlling an application timing of the magnetic field, and no external magnetic field is applied at the film formation time of the pinning layer 50. Alternatively, a method of applying a constant magnetic field at the film formation time at all times may be used.

Next, the invention of the magnetoresistance effect element having the magnetic multilayer film 1 as described in the first embodiment has been developed and a path through which electrons flow has been considered in detail, thereby achieving the invention of a first magnetoresistance device. The magnetoresistance device as described here comprises a magnetoresistance effect element, conductive films and electrode portions. More specifically, it is a device which is expressed with a broad conception covering a magnetoresistance effect type head (MR head), an MR sensor, a ferromagnetic memory element, an angle sensor or the like.

In the following description, a magnetoresistance effect type head (MR head) will be picked up and described as an example of the magnetoresistance device.

Figure 5:
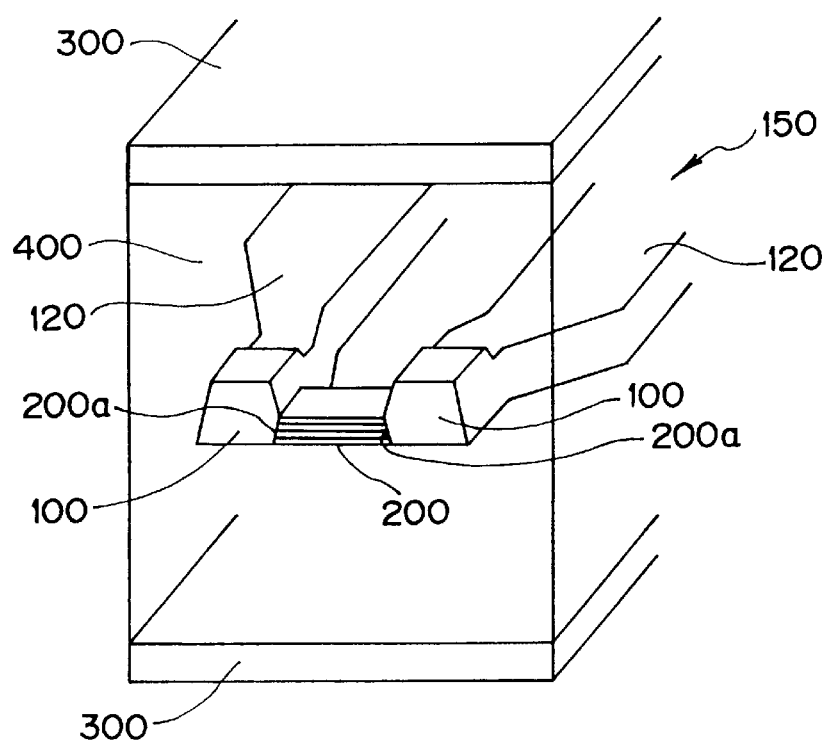
FIG. 5 is a partially-omitted cross-sectional view showing an embodiment of a magnetoresistance device of the present invention.
Figure 6:
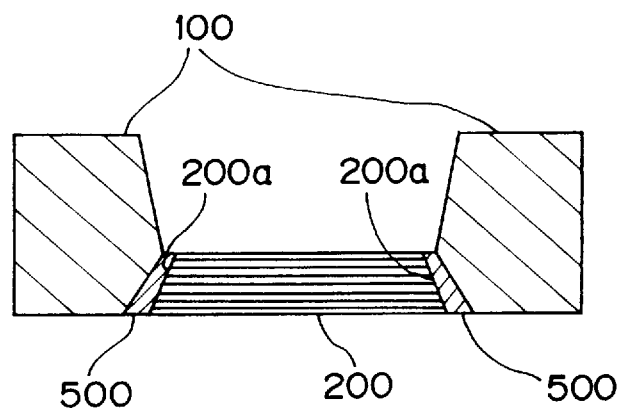
FIG. 6 is a cross-sectional view showing the construction of the magnetoresistance effect element (magnetic multilayer film) and electrode portions of the magnetoresistance device of the present invention.

As shown in FIG. 5, a first magnetoresistance effect type head (MR head) 150 comprises a magnetoresistance effect element 200 serving as a magnetically-sensitive portion for magnetically sensitizing a signal magnetic field, and electrode portions 100, 100 which are formed at both end portions 200a, 200a of the magnetoresistance effect element 200. Preferably, the whole both end portions 200a, 200a of the magnetoresistance effect element 200 serving as the magnetically-sensitive portion are connected to the electrode portions 100, 100. Conductive films 120, 120 are electrically conducted to the magnetoresistance effect element 200 through the electrode portions 100, 100. In this invention, the conductive film 120 and the electrode portion 100 are separately provided to simplify the description which will be made later, however, in most cases the conductive film 120 and the electrode portion 100 are originally formed integrally with each other by a thin film forming method. Accordingly, these elements may be considered as being formed of one member.

The magnetoresistance effect element 200 serving as the magnetically-sensitive portion of the first MR head has substantially the same laminate structure as the magnetoresistance effect element 3 having the magnetic multilayer film 1 shown in FIG. 1. That is, the magnetoresistance effect element 200 is replaced by the magnetoresistance effect element 3 having the magnetic multilayer film 1 shown in FIG. 1, so that the magnetoresistance effect element 200 comprises a non-magnetic metal layer 30, a ferromagnetic layer 40 formed on one surface of the non-magnetic metal layer 30, a soft magnetic layer 20 formed on the other surface of the non-magnetic metal layer 30,and a pinning layer 50 formed on the ferromagnetic layer 40 to pin the magnetization direction of the ferromagnetic layer 40. The ferromagnetic layer 40 and the pinning layer 50 are coupled to each other by the epitaxial growth.

As shown in FIG. 5, shield layers 300, 300 are formed so as to sandwich the magnetoresistance effect element 200 and the electrode portions 100, 100 at the upper and lower sides, and a non-magnetic insulation layer 400 is formed at a portion between the magnetoresistance effect element 200 and the shield layers 300, 300.

The same material and thickness as the film 1 used in the embodiment of the first magnetic multilayer film are preferably used for each of the ferromagnetic layer 40, the non-magnetic metal layer 30, the soft magnetic layer 20 and the pinning layer 50.

Here, the detailed consideration has been made on the path of electrodes flowing in the magnetic multilayer film of the magnetoresistance effect element 200, and as a result of the consideration, it has been found out that the electrons as current intensively flow through a certain portion in the magnetic multilayer film. That is,the pinning layer 50 is formed of material having large resistivity in the magnetic multilayer film. For example, FeMn has an extremely low resistivity of 100 to 200 $\mu\Omega$cm. Accordingly, the electrons intensively flow through the soft magnetic layer 20 and the non-magnetic metal layer 30 each having a low resistivity. In a conventional MR head, an NiFe layer serving as a magnetically-sensitive portion is formed, and then an electrode is formed on the upper surface of the NiFe layer. In this structure, the electrode is contacted with the pinning layer having a large resistivity, so that it is difficult for current to flow effectively. Furthermore, contact resistance is large and the yield on the manufacturing process is reduced. These problems can be solved by designing the current-flowing electrode portions 100 so that both end portions 200a, 200a thereof are wholly contacted with the magnetoresistance effect element 200 in the laminate direction as shown in FIG. 5. That is, the electrons intensively flow through the portion sandwiched between the soft magnetic layer 20 and the ferromagnetic layer 40. At this time, the electrons are magnetically scattered in accordance with the spin directions of the soft magnetic layer 20 and the ferromagnetic layer 40, so that the resistance is greatly varied. Accordingly, a fine change of the external magnetic field can be detected as a large change of electrical resistance.

Furthermore, the invention of the magnetoresistance effect element having the magnetic multilayer 2 as described with reference to FIG. 4 has been developed, and an embodiment of a second MR head which is a magnetoresistance device having two or more current-flowing paths with the pinning layer 50 at the center will be described. The basic construction of this embodiment is identical to that shown in FIG. 5, and a magnetoresistance effect element 200 having a magnetic multilayer film serving as a magnetically-sensitive portion has substantially the same laminate structure as the magnetoresistance effect element 4 having the magnetic multilayer film 2 shown in FIG. 4. That is, in FIG. 5, it may be considered that the magnetoresistance effect element 200 is substantially replaced by the magnetoresistance effect element 4 having the magnetic multilayer film 2 shown in FIG. 4. Both end portions 200a, 200a of the magnetoresistance effect element 200 are wholly contacted with the electrode portions 100. That is, the whole portion of the magnetoresistance effect element 200 in the laminate direction are contacted with the electrode portions.

The specific structure of the magnetoresistance effect element 200 in the second MR head will be described with reference to FIG. 4. The magnetic multilayer film of the magnetoresistance effect element 200 are constructed by successively laminating on a substrate 5 a metal undercoat layer 10, a soft magnetic layer 20, a non-magnetic metal layer 30, a ferromagnetic layer 40, a pinning layer 50, a ferromagnetic layer 40, a non-magnetic metal layer 30, a soft magnetic layer 20 and a metal protection layer 80. The pinning layer 50 and the pair of the ferromagnetic layers 40 are coupled to each other by the epitaxial growth.

The electrons flow in the multilayer film with a quantum probability because the thickness of each layer is extremely thin. That is, the electrons flows through the whole portion in the multilayer film in probability, however, the rate of the electrons flowing in a layer having a large resistivity is necessarily low. In general, the resistivity of the pinning layer 50 is two times or more as high as the non-magnetic metal layer 30 and the soft magnetic layer 20. For example, FeMn which is antiferromagnetic material has a resistivity of 100 to 200 $\mu\Omega$cm, and FeNi which is soft magnetic material has an extremely small resistivity of 15 to 30 $\mu\Omega$cm. Accordingly, the electrons intensively flow into the soft magnetic layer 20 and the non-magnetic metal layer 30 each having a low resistivity. In this case, the ferromagnetic layers 40, the non-magnetic metal layers 30 and the soft magnetic layers 20 are disposed substantially symmetrically with respect to the pinning layer 50 of large resistivity which is located at the center. Accordingly when the electrons flow in the multilayer film, there are two paths through which the electrons flow, the pinning layer 50 serving as a boundary between the two paths. As described above, the electrons flow through the whole portion in the multilayer film in probability, and thus at least two paths through which the electrons flow can be formed by disposing the layers of large resistivity in a suitable arrangement. As a result, the number of electrons which are magnetically scattered by the magnetization which are set to be in antiparallel to each other by the external magnetic field is increased, and thus a larger MR effect can be obtained than in the case where substantially only one current path is provided.

At this time, in order to form at least two paths in which electrons substantially flow, it is preferable that the resistivity relationship among the pinning layer 50, the ferromagnetic layer 40 and the soft magnetic layer 20 satisfies the following equation (1), where the resistivity of the pinning layer 50 is represented by $\rho_p$; the resistivity of the ferromagnetic layer 40, $\rho_f$; and the resistivity of the soft magnetic layer 20, $\rho_s$:

$$3((\rho_f+\rho_s)/2)<\rho_p<30((\rho_f+\rho_s)/2) \qquad \text{equation}(1)$$

The number of the paths through which the electrons substantially flow is preferably equal to 2 to 10. This may be performed by forming the multilayer film containing one to four pinning layers 50 in the same structure as described above. When three paths are provided, a soft magnetic layer 20, a non-magnetic metal layer 30, a ferromagnetic layer 40, a pinning layer 50, a ferromagnetic layer 40, a non-magnetic metal layer 30, a soft magnetic layer 20, a non-magnetic metal layer 30, a ferromagnetic layer 40, a pinning layer 50, a ferromagnetic layer 40, a non-magnetic metal layer 30, a soft magnetic layer 20 and a protection layer 80 are successively laminated in this order on the metal undercoat layer 10 on the substrate 5. When four paths are provided, on the metal undercoat layer 10 on the substrate 5 are successively laminated a soft magnetic layer 20, a non-magnetic metal layer 30, a ferromagnetic layer 40, a pinning layer 50, a ferromagnetic layer 40, a non-magnetic metal layer 30, a soft magnetic layer 20, a non-magnetic metal layer 30, a ferromagnetic layer 40, a pinning layer 50, a ferromagnetic layer 40, a non-magnetic metal layer 30, a soft magnetic layer 20, anon-magnetic metal layer 30, a ferromagnetic layer 40, a pinning layer 50, a ferromagnetic layer 40, a non-magnetic metal layer 30, a soft magnetic layer 20 and a protection layer 80 in this order. When ten or more paths are provided, the thickness of the whole magnetic multilayer film is large, so that it is not applicable to the MR head or the like for ultrahigh density magnetic recording. The number of the paths may be equal to one, however, it should be set to two or more to obtain a larger MR effect. Practically, it is preferably set to 2 to 5.

As described above, both the whole end portions 200a, 200a of the magnetoresistance effect element 200 are contacted with the electrode portions 100. Therefore, all the electrons intensively and equivalently flow into the two or more portions which are sandwiched between the soft magnetic layer 20 and the ferromagnetic layer 40. Accordingly, the rate of the electrons which are magnetically scattered by the direction of the spins of the soft magnetic layer 20 and the ferromagnetic layer 40 is more increased as compared with the case where one path is provided, so that the magnetoresistance change is enhanced. Accordingly, a fine change of external magnetic field can be detected as a large change of electrical resistance. Furthermore, the pinning layer 50 has a large resistivity of 100 $\mu\Omega$cm or more, so that the resistivity of the whole magnetic multilayer film serving as the magnetically-sensitive portion is increased. It is 3 to 10 times as high as the conventional material, NiFe (permalloy), however, by forming a number of current-flowing paths as described above, the resistivity can be reduced to the same degree as permalloy. As a result, temperature rise-up in the magnetically-sensitive portion due to flow of a measurement current and deterioration in characteristics caused by the temperature rise-up can be avoided.

Furthermore, as described above, in a case where two or more electron-flowing paths are formed with the pinning layer 50 serving as the boundary, the balance between the layer thickness and the scattering efficiency becomes best when the thickness of each layer is adjusted to satisfy the following equation:

$$0.3 \text{ Ms} \leq \text{Mf} \leq 0.8 \text{ Ms, preferably } 0.4 \text{ Ms} \leq \text{Mf} \leq 0.7 \text{ Ms,}$$

where the magnetization of the ferromagnetic layer is represented by Mf and the magnetization of the soft magnetic layer is represented by Ms.

The material and thickness of each layer of the magnetoresistance effect element 200 serving as the magnetically-sensitive portion of the second MR head is identical to those of the magnetoresistance effect element 4 having the magnetic multilayer film as described above.

As described above, at least at the film formation time of the soft magnetic layer 20, the external magnetic field is applied in one direction within the film plane to induce anisotropic magnetic field Hk, thereby making the high-frequency characteristic excellent. Here, the external magnetic field is applied in such a direction that a electric current flows to induce the MR effect in the magnetic multilayer, thereby inducing the anisotropic magnetic field. Usually, the magnetic multilayer film is processed in a strip form, and the electric current is controlled to flow along the longitudinal direction of the magnetic multilayer film. Therefore, it is best to perform the film formation while applying the magnetic field in the longitudinal direction. In other words, it is preferable that the film formation is performed while the magnetic field is applied in the same direction as the electric current flow of the MR head, that is, in a direction which is perpendicular to the signal magnetic field direction and is an in-plane direction. Accordingly, in the soft magnetic layer constituting the magnetic multilayer film in the shape of the strip, the longitudinal direction thereof becomes a magnetization-easy direction, and the short-side direction thereof becomes a magnetization-hard direction, so that anisotropic magnetic field Hk occurs. In this case, since the signal magnetic field is applied in the short-side direction of the magnetic multilayer film in the shape of the strip, the high-frequency magnetic characteristic of the soft magnetic layer is improved, and the large MR characteristic in a high frequency area can be obtained. It is preferable that the magnitude of the applied magnetic field is in the range of 10 to 300 Oe. The anisotropic magnetic field Hk which is induced in the soft magnetic layer 20 is in the range of 3 to 20 Oe, preferably 3 to 16 Oe, more preferably 3 to 12 Oe. If the anisotropic magnetic field Hk is lower than 3 Oe, it is equal to the same degree as the coercive force of the soft magnetic layer 20, so that no linear MR change curve can be substantially obtained in the vicinity of the zero magnetic field. Therefore, the characteristic as the MR head is deteriorated. On the other hand, if the anisotropic magnetic field Hk is higher than 20 Oe, the MR slope (MR ratio per unit magnetic field) is reduced, so that the output is liable to be reduced and the resolution is reduced when it is used as the MR head or the like. The film of the present invention exhibits high heat resistance, and its MR slope at the rise-up portion of the MR change curve is above 0.3%/Oe or more, particularly 0.4%/Oe or more, usually 0.4 to 1.0%/Oe. The maximum hysteresis width of the MR change curve is equal to 8 Oe or less, usually 0 to 6 Oe. In addition, the MR slope at the high-frequency magnetic field of 1 MHz can be equal to 0.2%/Oe or more, preferably 0.25 0%/Oe or more, usually 0.3 to 1.0%/Oe. Therefore, sufficient performance can be obtained as the reading MR head or the like for the high density recording.

Furthermore, when an antiferromagnetic layer is formed as the pinning layer 50, the magnetic field is preferably applied in a direction perpendicular to the direction of the magnetic field applied at the film formation time of the soft magnetic film 20. That is, it is applied within the film plane of the magnetic multilayer film and in a direction vertical to the measurement direction. The magnitude of the applied magnetic field is preferably set in the range of 10 to 300 Oe. With this operation, the magnetization direction of the ferromagnetic layer 40 is surely fixed in the applied magnetic field direction (the direction perpendicular to the measurement current) by the pinning layer 50, whereby the magnetization of the ferromagnetic layer can be most reasonably set to be in antiparallel to the magnetization of the soft magnetic layer 20 whose direction can be freely changed by the signal magnetic field. However, this is not a necessary condition, and the direction of the magnetic field to be applied at the film formation time of the antiferromagnetic layer may be coincident with the direction of the magnetization of the magnetic field to be applied at the film formation time of the soft magnetic layer. At this time, it is preferable that the temperature is decreased while applying the magnetic field in a stripe short-side direction (a direction perpendicular to the direction of the applied magnetic field when the soft magnetic layer 20 is formed), when the heat treatment at about 200° C. is carried out in the process after the magnetic multilayer film is formed.

The rise-up portion of the MR curve is determined by the rotation of the magnetization of the soft magnetic layer 20. In order to obtain a sharper rise-up of the MR curve, it is preferable that the magnetization direction of the soft magnetic layer 20 is perfectly varied due to the magnetization rotation in accordance with the signal magnetic field. However, actually, magnetic domains occur in the soft magnetic layer 20, and a movement of domain wall and a magnetization rotation occur simultaneously, so that Barkhausen noises are produced and thus the MR head characteristic is not stabilized.

Accordingly, as a result of inventor's earnest studies, it has been found out that the noises can be reduced by interposing a linking soft magnetic layer 500 between the magnetoresistance effect element 200 and each of the electrode portions 100 through which the measurement current flows. Of course, in this case, the linking soft magnetic layers 500 are connected to the magnetoresistance effect element 200 in contact with the whole end portions 200a, 200a. The linking soft magnetic layers 500, 500 which are formed adjacently to the magnetoresistance effect element (magnetic multilayer film) are magnetically directly contacted with the soft magnetic layer constituting the magnetic multilayer film. The added linking soft magnetic layer 500 has an effect of approaching the magnetic domains of the soft magnetic layer in the magnetic multilayer film to a magnetic monodomain structure and stabilize the magnetic domain structure. As a result, the soft magnetic layer in the magnetic multilayer film acts in a magnetization rotation mode to the signal magnetic field, and an excellent characteristic having no noise can be obtained.

Figure 7:
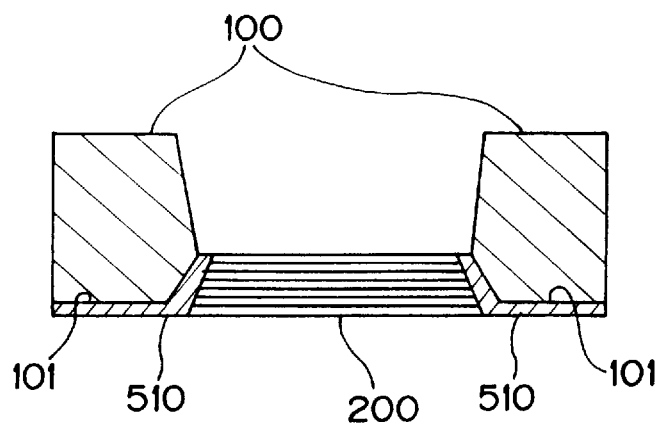
FIG. 7 is a cross-sectional view showing another example of the construction of the magnetoresistance effect element (magnetic multilayer film) and the electrode portions of the magnetoresistance device of the present invention.

In order to make approaching the magnetic domains of the soft magnetic layer in the magnetic multilayer film to the magnetic monodomain and stabilize the magnetic domain structure, linking soft magnetic layers 510, 510 having such a shape as shown in FIG. 7 are preferably provided. The linking soft magnetic layers 510 are formed not only between the magnetoresistance effect element 200 serving as the magnetically-sensitive portion and the electrode portions 100, but also on the lower surfaces 101 of the electrode portions 100 continuously. This is because the degree of stabilization is larger as the volume of the linking soft magnetic layer 510 to stabilize the magnetic domain structure increases. In addition, if it is directly contacted with the electrode portion 100, there occurs no voltage effect, and it is favorable because the MR effect of the magnetic-domain stabilizing linking soft magnetic layer itself has no effect on the MR effect of the magnetic multilayer film. Furthermore, in order to further positively stabilize the magnetic domains of the soft magnetic layer in the magnetic multilayer film, an antiferromagnetic layer may be interposed between the electrode portions 100 and the linking soft magnetic layers to stabilize the magnetic domain structure.

In general, in an MR head using permalloy, a shunt layer formed of Ti or the like and a bias magnetic-field applying layer of soft magnetic material having high resistivity such as CoZrMo, NiFeRh or the like, are usually provided adjacently to the magnetically-sensitive portion. These are called as soft film bias or shunt bias, and act to shift the curve of permalloy and produce a linear area in the vicinity of the zero magnetic field. However, the mechanism of this phenomenon is complicated, and it is actually a factor of greatly reducing the manufacturing yield. On the other hand, in the magnetoresistance effect element (magnetic multilayer film) of the present invention as described above, the MR curve rises up just in the vicinity of the zero magnetic field, so that a linear area can be produced in the vicinity of the zero magnetic field by a self-bias which is caused by electric current flowing in the magnetoresistance effect element (magnetic multilayer film). As a result, a biasing means having a complicated mechanism is not required, so that the manufacturing yield can be improved, the manufacturing time can be shortened and the cost can be reduced. Furthermore, the thickness of the magnetically-sensitive portion is thinner because no biasing mechanism is required, so that the shield thickness is made thin when it is used as the MR head, and it is greatly effective to shorten the wavelength of signals for the ultrahigh density recording.

When these MR heads are manufactured, heat treatments such as baking, annealing, resist curing, etc. are indispensable for a patterning process, a flattening process, etc. in the manufacturing process.

In general, a problem of heat-resistance frequently occurs in the magnetoresistance effect element having the magnetic multilayer film, which is called as superlattices, due to the thickness of each layer. According to the magnetoresistance effect element(magnetic multilayer film) of the present invention, the magnetic field is applied to provide anisotropic magnetic field in the magnetic layer, so that it can endure a heat treatment at a temperature below 500° C. or less, generally 50° to 400° C., 100° to 300° C. for about two hours. The heat treatment is generally performed under vacuum, inert gas atmosphere, or atmospheric air. Particularly, if the heat treatment is conducted under a vacuum (pressure-reduced) state below $10^{-7}$ Torr or less, a magnetoresistance effect element (magnetic multilayer) whose characteristic is extremely less deteriorated can be obtained. Furthermore, the MR characteristic is little deteriorated even by a lapping or a polishing in a processing process.

The invention of the first and second magnetoresistance effect elements and the invention of the first and second magnetoresistance devices (for example, MR head) will be described in more detail using the following examples. First, an example of the invention of the magnetoresistance effect element 3 having the magnetic multilayer film 1 (corresponding to FIG. 1) is first described as an example 1.

EXAMPLE 1

A glass substrate was used as the substrate. The glass substrate was placed in an ion-beam sputtering device, and evacuated until $1 \times 10^{-7}$ Torr. The substrate was cooled and kept at 10° C., and an artificial lattice magnetic multilayer film having the following composition was formed on the substrate being rotated at 20 r.p.m. At this time, the film formation was carried out at a film growth rate of about 0.3 Å/second or less while a magnetic field was applied in a direction of a parallel to a measurement electric current and in an in-plane direction. Ar flow rate was set to 8 to 10 SCCM, an acceleration voltage of a sputter gun was set to 300V and an ion electric current was set to 30 mA. After the film formation, the resultant was cooled from 150° C. under a pressure of $10^{-5}$ Torr while a magnetic field of 200 Oe was applied in a direction of a vertical to the measurement electric current and in the in-plane direction, thereby a pinning effect in the ferromagnetic layer was induced. Samples 1 to 11 shown in table 1 were prepared in the manner as described above.

In table 1, sample 1 was formed of $[Ni_{0.81}Fe_{0.19}(70)\text{-}Cu(30)\text{-}Ni_{0.81}Fe_{0.19}(70)\text{-}Fe_{0.5}Mn_{0.5}(70)]$, and it was a magnetic multilayer film obtained by successively sputtering a 70 Å-thickness soft magnetic layer of permalloy alloy composition (NiFe) containing Ni81%-Fe19%, a 30 Å-thickness non-magnetic metal layer of Cu, a 70 Å-thickness ferromagnetic layer of NiFe, and a 70 Å-thickness antiferromagnetic layer of FeMn alloy containing Fe50%-Mn50%. The materials of the soft magnetic layer, the non-magnetic metal layer, the ferromagnetic layer and the pinning layer of each sample are represented by (m1, m2, m3, m4) in this order. The thickness of the respective layers is represented by (t1, t2, t3, t4) in this order in table 1. Each sample was provided with Ta layers of 50 Å as the undercoat layer (between the substrate and the soft magnetic layer) and the protection layer (on the antiferromagnetic layer).

For the material m1 in the table 1, NiFe (samples 1, 2, 3, 10 to 13, 15, 17) represents $Ni_{0.81}Fe_{0.19}$ (weight ratio), CoFeNiB (samples 4, 7) represents $(Co_{0.88}Fe_{0.06}Si_{0.06})_{0.80}B_{0.20}$ (atomic ratio), NiFeCo (samples 5, 9) represents $Ni_{0.17}Fe_{0.35}Co_{0.48}$ (weight ratio), and NiFeCo (samples 6, 8) represents $Ni_{0.15}Fe_{0.69}Co_{0.16}$ (weight ratio).

For the material m4 in the table 1, the samples 1, 2, 4 to 7 are examples of the antiferromagnetic layer, the samples 8, 9 are examples of the hard magnetic layer, the samples 3 and 10 are examples of ferromagnetic layers of different materials, and the sample 11 is an example of a structural defect introduced layer, that is, an example in which this layer was formed while introducing structural defects at the film formation time of $Fe_{30}Tb_{70}$. Furthermore, for the material m4 in the table 1, CoPt of the sample 8 represents $Co_{0.14}Pt_{0.86}$ (atomic ratio), CoSm of the sample 9 represents $Co_{0.63}Sm_{0.37}$ (atomic ratio), CoFe of the sample 3 represents $Co_{0.81}Fe_{0.19}$, and CoFeNi of the sample 10 represents $Co_{0.72}Fe_{0.13}Ni_{0.15}$.

Next, characteristic estimation which is common in the respective inventions will be described hereunder. A B-H loop was measured by means of a vibrating sample magnetometer (VSM). A measurement of resistance was performed as follows. Samples having a shape of 0.5×10 mm were prepared from the samples having the compositions shown in the table 1, and the resistance of each sample was measured by a four-terminal method in which an external magnetic field was applied to the sample in the in-plane direction and in a direction of a perpendicular to the electric current while the external magnetic field was varied from −300 to 300 Oe. On the basis of the measured resistance, the minimum value of the resistivity $\rho_{sat}$ and the MR ratio $\Delta R/R$ were calculated. The MR ratio $\Delta R/R$ was calculated according the following equation:

$$\Delta R/R = (\rho_{max} - \rho_{sat}) \times 100 / \rho_{sat} \ (\%),$$

where the maximum resistivity is represented $\rho_{max}$ and the minimum resistivity is represented by $\rho_{sat}$. Furthermore, the differential curve was obtained from a measured MR curve, and with respect to the rise-up characteristic, the maximum value in the vicinity of the zero magnetic field was estimated as the MR slope (unit %/Oe). This value is required to be 0.3%/Oe or more as described above.

Figure 8:
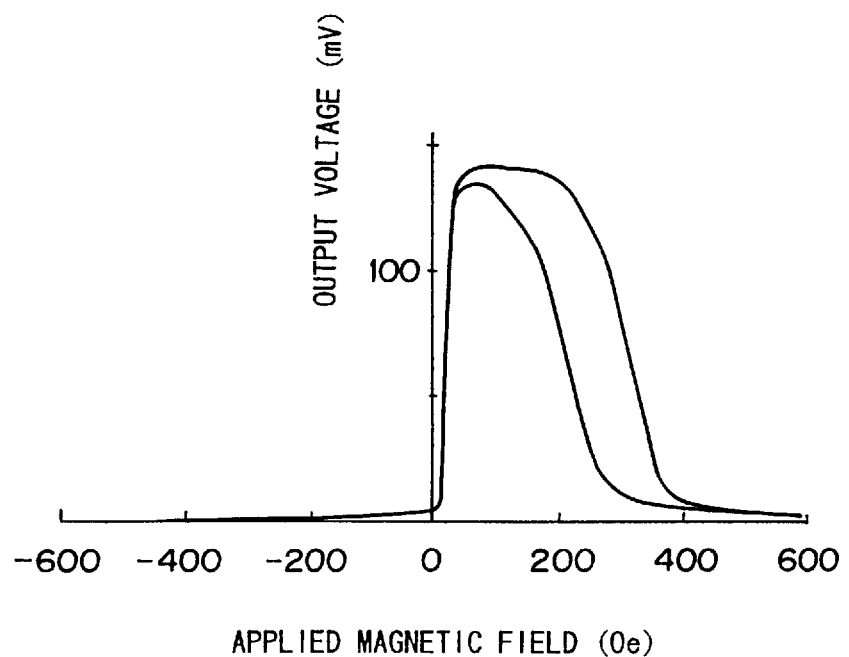
FIG. 8 shows an example of the MR curve under a DC magnetic field of the magnetoresistance effect element (magnetic multilayer) of the first invention.

The sample 1 has NiFe (permalloy) for the two magnetic layers. It has an MR ratio of 1.8%, and a large MR slope of 0.57%/Oe. FIG. 8 is a graph showing an MR curve measured under a DC magnetic field, and it shows the output voltage at a measurement electric current of 5 mA. The MR curve sharply rises up in the vicinity of the zero magnetic field, and it has a large MR slope. In the sample 2, the ferromagnetic layer of Co was formed, and in the sample 3, the pinning layer was formed by direct exchange-coupling with a ferromagnetic layer having different material. In the sample 3, before the FeCo layer was deposited in a manner of the sputtering, the Co layer was irradiated with an assist ion beam under the following condition to roughen the interface portion,: Ar flow rate of 10 SCCM, ion gun acceleration voltage of 100V and ion electric current of 10 mA, whereby artificial structural defects were introduced.

Furthermore, in the samples 1 to 11 as shown in the table 1, each section of samples was observed by using X-ray diffraction and a transmission electron microscope. As a result, it was confirmed that the lattice fringes of the respective ferromagnetic layer and the so-called pinning layer were linked to each other and thus both the layers were formed by the epitaxial growth.

The sample 12 (comparative example) shown in the table 1 had the same multilayer structure as the sample 1, however, in this sample, the ferromagnetic layer and the so-called pinning layer were not formed by the epitaxial growth due to the difference of a film forming condition therebetween. The specific film forming condition of the sample 12 (comparative example) was set to Ar flow rate of 10 to 20 SCCM, sputtering gun acceleration voltage of 1200V and ion electric current of 120 mA, and the other condition was identical to the film formation condition as described above. Under such a film forming condition, the energy of sputtering beams is large, and thus particles which are sputtered from a target onto a substrate also have large kinetic energy. Therefore, the respective layer materials are mutually diffused into each other at the interfaces of the magnetic multilayer film, and no film based on the epitaxial growth can be obtained.

In each of the sample 13 (comparative example) and 14 (comparative example), no pinning layer (corresponding to m4) was formed.

The sample 15 (comparative example) had the same multilayer structure as the sample 1, however, in this sample the ferromagnetic layer and the so-called pinning layer were not formed by the epitaxial growth due to the difference of the film forming condition therebetween. That is, in the sample 15 (comparative example), the film formation was performed by an RF sputtering method. The ultimate pressure was set to $6 \times 10^{-7}$ Torr and the pressure at the film formation time was set to 0.5 mTorr. The Ar flow rate was set to 8 to 20 SCCM. The section of the multilayer film was observed by a high-resolution transmission electron microscope (TEM), and as a result no crystal lattice fringe between the pinning layer and the ferromagnetic layer was observed. Accordingly, no epitaxial growth state existed between these layers.

The sample 16 (comparative example) had the same multilayer structure as the sample 8, however, in this sample the ferromagnetic layer and the pinning layer were not formed by the epitaxial growth due to the difference of the film forming condition therebetween. The sample 16 (comparative example) was formed by the same film forming method as the sample 15 (comparative example).

The sample 17 (comparative example) had the same multilayer structure as the sample 10, however, in this sample the ferromagnetic layer and the so-called pinning layer were not formed by the epitaxial growth due to the difference of the film forming condition therebetween. The sample 17 (comparative example) was formed by the same film forming method as the sample 15 (comparative example).

TABLE 1

| Sample No. | Material (m1, m2, m3, m4) | Layer thickness (t1, t2, t3, t4) | $\rho sat$ ($\mu\Omega cm$) | MR ratio (%) | MR slope (%/Oe) |
|---|---|---|---|---|---|
| 1 | (NiFe, Cu, NiFe, FeMn) | (70, 30, 70, 70) | 55.6 | 1.8 | 0.57 |
| 2 | (NiFe, Cu, Co, FeMn) | (70, 35, 60, 70) | 56.3 | 2.1 | 0.52 |
| 3 | (NiFe, Cu, Co, CoFe) | (60, 30, 80, 60) | 45.2 | 1.6 | 0.43 |
| 4 | (COFeSiB, Cu, Co, FeMn) | (80, 25, 40, 120) | 60.5 | 3.5 | 0.48 |
| 5 | (NiFeCo, Cu, CoNi, FeMn) | (70, 35, 60, 100) | 57.2 | 3.1 | 0.41 |
| 6 | (NiFeCo, Cu, Co, $Fe_2O_3$) | (80, 30, 60, 500) | 88.6 | 4.2 | 0.78 |
| 7 | (CoFeSiB, Cu, CoFe, $Fe_2O_3$) | (80, 30, 60, 300) | 66.9 | 5.3 | 0.72 |
| 8 | (NiFeCo, Cu, Co, CoPt) | (90, 50, 20, 80) | 46.1 | 1.7 | 0.37 |
| 9 | (NiFeCo, Cu, Co, CoSm) | (60, 40, 30, 500) | 75.3 | 1.5 | 0.35 |
| 10 | (NiFe, Cu, NiFe, CoFeNi) | (50, 30, 20, 60) | 42.8 | 1.6 | 0.34 |
| 11 | (NiFe, Cu, NiFe, FeTh) | (60, 30, 80, 200) | 72.3 | 2.5 | 0.37 |

TABLE 1-continued

| Sample No. | Material (m1, m2, m3, m4) | Layer thickness (t1, t2, t3, t4) | ρsat ($\mu\Omega$cm) | MR ratio (%) | MR slope (%/Oe) |
|---|---|---|---|---|---|
| 12 (compara.) | (NiFe, Cu, NiFe, FeMn) | (70, 80, 70, 70) | 65.6 | 0.3 | 0.07 |
| 13 (compara.) | (NiFe, Cu, NiFe) | (20, 40, 20) | 28.7 | 1.1 | 0.18 |
| 14 (compara.) | (Co, Ag, Co) | (10, 30, 10) | 18.9 | 0.9 | 0.11 |
| 15 (compara.) | (NiFe, Cu, NiFe, FeMn) | (70, 30, 70, 70) | 73.2 | 1.1 | 0.07 |
| 16 (compara.) | (NiFeCo, Cu, Co, CoPt) | (90, 50, 20, 80) | 52.8 | 0.9 | 0.16 |
| 17 (compara.) | (NiFe, Cu, NiFe, CoFeNi) | (50, 30, 20, 60) | 51.2 | 1.6 | 0.15 |

It is apparent from the result of the table 1 that a large MR slope exceeding 0.3%/Oe can be obtained by forming the ferromagnetic layer and the so-called pinning layer through epitaxial growth to pin the magnetization direction of the ferromagnetic layer (the samples 1 to 11 of the present invention). The pinning effect cannot be obtained unless the pinning layer and the magnetic layer are formed by the epitaxial growth. Furthermore, it is apparent that the pinning effect is achieved by one selected from the antiferromagnetic layer, the hard ferromagnetic layer, the ferromagnetic layer formed different material and the layer doped with the artificial structural defects.

Next, an example of the invention of the magnetoresistance effect element 4 having the magnetic multilayer film 2 (corresponding to FIG. 4) will be described.

EXAMPLE 2

A glass substrate was used as the substrate. The glass substrate was placed in an ion-beam sputtering device, and evacuated until $1 \times 10^{-7}$ Torr. The substrate was cooled and kept at 10° C., and an artificial lattice magnetic multilayer film having the following composition was formed on the substrate which was rotated. At this time, the film formation was performed at a film growth rate of about 0.3 Å/second or less, while a magnetic field was applied in a direction of a parallel to a measurement electric current and in an in-plane direction. Ar flow rate was set to 8 SCCM, an acceleration voltage of sputter gun was set to 300V and an ion electric current was set to 30 mA. After the film formation, the resultant was cooled from 150° C. under a pressure of $10^{-7}$ Torr while a magnetic field of 200 Oe was applied in a direction of a vertical to the measurement electric current and in the in-plane direction, thereby a pinning effect in the ferromagnetic layer was induced.

The construction of the magnetic multilayer film and the magnetoresistance ratio are shown in the following table 2.

In table 2, sample 2-1 was formed of [$Ni_{0.81}Fe_{0.19}$(70)-Cu(30)-$Ni_{0.81}Fe_{0.19}$(70)-$Fe_{0.5}Mn_{0.5}$(70)-$Ni_{0.81}Fe_{0.19}$(70)-Cu(30)-$Ni_{0.81}Fe_{0.19}$(70)], and it was a magnetic multilayer film in which a 70 Å-thickness NiFe alloy layer used as a ferromagnetic layer, a 30 Å-thickness non-magnetic metal layer of Cu, a 70 Å-thickness soft magnetic layer of permalloy composition (NiFe) containing Ni81%-Fe19%, and a 70 Å-thickness Ta metal layer are successively laminated on each of both sides of a 70 Å-thickness antiferromagnetic layer (pinning layer) of FeMn alloy containing Fe50%-Mn50%. The materials of the soft magnetic layer, the non-magnetic metal layer, the ferromagnetic layer and the antiferromagnetic layer (pinning layer) constituting each sample are represented by (m1, m2, m3, m4) in this order. The thickness of the respective layers is represented by (t1, t2, t3, t4) in this order in table 2. In the following examples, each composition of NiFe and FeMn layers is identical to that of the example 1. The MR slope under the DC magnetic field and the MR slope (unit %/Oe) at 6 Oe width under high-frequency magnetic field of 1 MHz are shown, respectively. As described above, this value is required to be 0.2%/Oe or more. In addition, the value of Mf/Ms is also shown, where the magnetization of the ferromagnetic layer is represented by Mf and the magnetization of the soft magnetic layer is represented by Ms. The thickness of each layer is selected so that the above value(Mf/Ms) is equal to 0.3 to 0.8.

TABLE 2

| Sample No. | Material (m1, m2, w3, w4) | Layer thickness (t1, t2, t3, t4) | ρsat ($\mu\Omega$cm) | MR ratio (%) | MR slope (%/Oe) | High frequency MR slope (%/Oe) | Mf/Ms |
|---|---|---|---|---|---|---|---|
| 2-1 | (NiFe, Cu, NiFe, FeMn) | (70, 30, 40, 70) | 37.6 | 2.8 | 0.75 | 0.60 | 0.57 |
| 2-2 | (NiFe, Cu, Co, FeMn) | (80, 35, 40, 70) | 36.3 | 2.9 | 0.71 | 0.52 | 0.67 |
| 2-3 | (NiFe, Cu, Co, FeCo) | (60, 80, 80, 60) | 31.4 | 1.8 | 0.51 | 0.46 | 0.67 |
| 2-4 | (NiFe, Cu, Co) | (50, 50, 50) | 17.0 | 5.6 | 0.53 | 0.49 | — |
| 1 | (NiFe, Cu, NiFe, FeMn) | (70, 30, 70, 70) | 55.6 | 1.8 | 0.57 | 0.26 | 1.00 |
| 2 | (NiFe, Cu, Co, FeMn) | (70, 35, 60, 70) | 56.3 | 2.1 | 0.52 | 0.27 | 1.14 |
| 2-5 (compara.) | * | | 47.0 | 0.8 | 0.38 | 0.20 | — |

*: NiFe (70A) -Cu (30A)-NiFe (70A)-FeMn (70A)-Cu (30A)-NiFe (70A)-Cu (30A)-NiFe (70A)-FeMn (70A)-Cu (50A)

The samples 2-1 to 2-4 shown in the table 2, have the structure of the magnetoresistance effect element 4 having the magnetic multilayer film 2 (corresponding to FIG. 4), and the samples 1 and 2 shown in table 2 are identical to the samples 1 and 2 of the table 1, where one soft magnetic layer and one antiferromagnetic layer are provided (corresponding to FIG. 1). Each section of the laminate film samples was observed with X-ray diffraction and the transmission electron microscope, and it was confirmed that the lamination of the ferromagnetic layer and the pinning layer in the samples 2-1 to 2-4 and the samples 1 and 2 were formed by the epitaxial growth.

In the sample 2-5 (comparative example), Ta(50 Å) was formed as an undercoat layer on the substrate, and then NiFe(70 Å), Cu(30 Å), NiFe(70 Å), FeMn(70 Å), Cu(30 Å), NiFe(70 Å), Cu(30 Å), NiFe(70 Å), FeMn(70 Å) and Cu(30 Å) were successively formed on the undercoat layer in this order. The film was formed as the same condition as that of the sample 12. As a result, it was confirmed for the sample 2-5 (comparative example) that the ferromagnetic layer and the so-called pinning layer were not coupled to each other with the epitaxial growth.

Figure 9A:
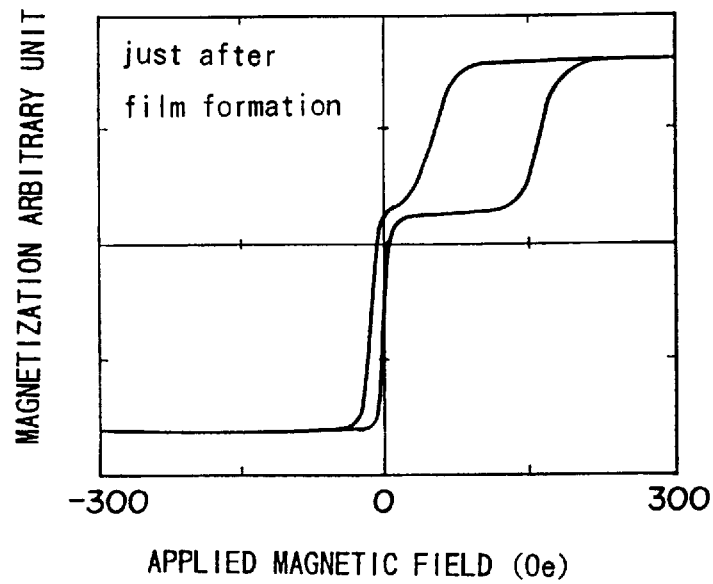
FIGS. 9(A) and 9(B) are graphs showing the magnetization curve and the MR curve under the DC magnetic field of the magnetoresistance effect element (magnetic multilayer film) of the second invention.
Figure 9B:
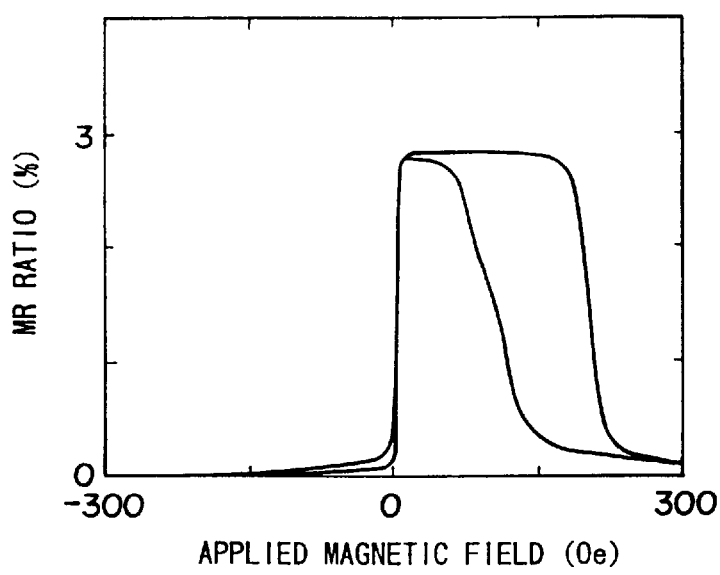

The magnetization curve and the MR curve of the sample 2-1 in the table 2 are shown in FIGS. 9(A) and (B), respectively. As described later, the magnetization curve of the sample 1 of the table 1 (identical to the sample 1 of the table 2) is shown in FIGS. 10(A) and (B).

By comparing these curves, it is found that the magnetoresistance effect element 4 having the magnetic multilayer film 2 according to the present invention has a larger MR slope at the rise-up portion of the MR curve, and thus the magnetic field shift amount Hex due to the exchange-coupling between the antiferromagnetic layer and the ferromagnetic layer is larger.

Furthermore, from the result of the table 2, it is found out that by laminating the ferromagnetic layer, the non-magnetic metal layer and the soft magnetic layer in this order on each of both sides of the pinning layer, and particularly by coupling the pinning layer and the ferromagnetic layers at both side of the pinning layer with the epitaxial growth, not only the MR ration and the MR slope under the DC magnetic field, but also the high-frequency MR characteristic which is most important for practical use and represented by the MR slope at 1 MHz can be greatly improved. With this structure, particularly only the samples 2-1 to 2-4 exhibit a large high-frequency MR slope exceeding 0.3%/Oe.

Furthermore, it is found out that on condition of $0.3 \leq Mf/Ms \leq 0.8$ (Mf: magnetization of the ferromagnetic layer, Ms: magnetization of the soft magnetic layer), an excellent high-frequency MR characteristic can be obtained.

Further, the sample 1 of the table 1 and the sample 2-1 of the table 2 were subjected to the heat treatment at 230° C. for 4 hours under a vacuum state of $10^{-5}$ Torr. $\rho_{sat}$, MR ratio, MR slope under DC magnetic field and high-frequency MR slope after the heat treatment are shown in table 3.

TABLE 3

| Sample No. | ρsat (μΩcm) | MR ratio (%) | MR slope (%/Oe) | High frequency MR slope (%/Oe) |
|---|---|---|---|---|
| 1 | 54.2 | 1.9 | 0.59 | 0.24 |
| 2-1 | 39.1 | 2.7 | 0.72 | 0.58 |

From the result of the table 3, there occurred little deterioration in characteristics both at the initial stage and after the heat treatment. That is, the magnetoresistance effect element 4 having the magnetic multilayer film 2 exhibits a large MR slope which exceeds 0.3%/Oe under a large DC magnetic field, and a large high-frequency MR slope at 1 MHz.

Figure 12A:
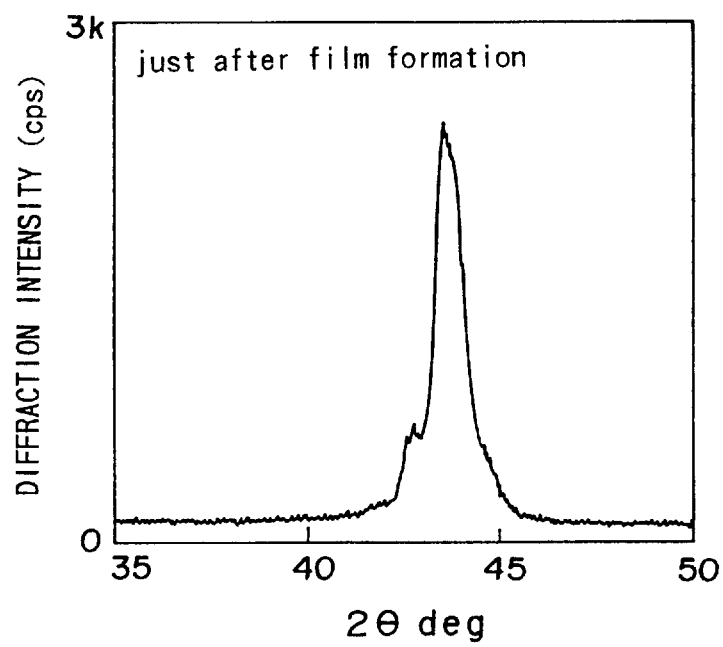
FIGS. 12(A), (B) are graphs showing an X-ray diffraction pattern just after the film formation and after the heat treatment of the magnetoresistance effect element (magnetic multilayer film) of the second invention.
Figure 12B:
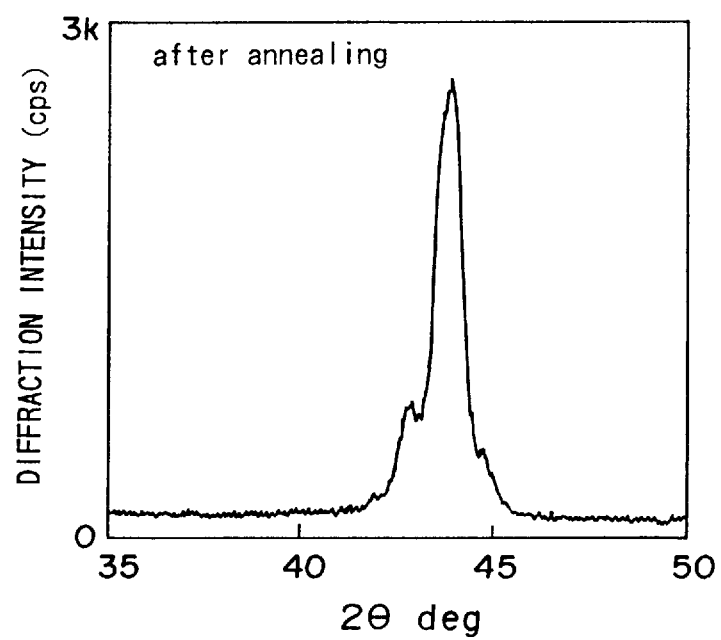

FIGS. 10(A) and (C) show the magnetization curves of the magnetic multilayer film constituting the sample 1 of the table 1 just after the film formation is performed and after the heat treatment is performed, respectively. FIGS. 10(B) and (D) show the MR curves of the magnetic multilayer film constituting the sample 1 of the table 1 just after the film formation is performed and after the heat treatment is performed, respectively. FIGS. 11(A) and (C) show the magnetization curves of the magnetic multilayer film constituting the sample 2-1 of the table 2 just after the film formation is performed and after the heat treatment is performed, respectively. FIGS. 11(B) and (D) show the MR curves of the magnetic multilayer film constituting the sample 2-1 of the table 2 just after the film formation is performed and after the heat treatment is performed, respectively. In the sample 2-1, the intensity of the exchange-coupling force is different between the upper and lower portions of the antiferromagnetic layer (pinning layer), so that Hex is also different between the upper and lower soft magnetic layers after the heat treatment. However, both the samples have little variation of the rise-up portion of the MR curve in the vicinity of the zero magnetic field, which is practically important, and the excellent MR characteristic of the magnetization curve can be kept both just after the film formation is performed and after the heat treatment. FIGS. 12(A) and (B) show the X-ray diffraction curves of the sample 2-2 of the table 2 just after the film formation is performed and after the heat treatment. The diffraction intensity of a (111)-orientation plane from the NiFe and Co layers at the angle of about 44 degrees is slightly higher after the heat treatment than just after the film formation, however, there is substantially little variation.

Figure 13:
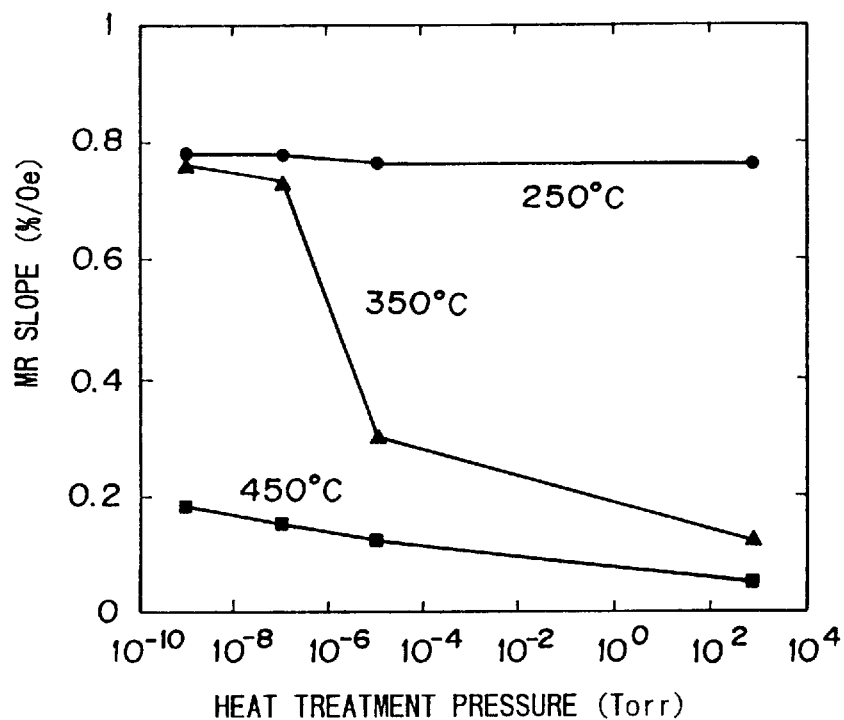
FIG. 13 is a graph showing the relationship between pressure and MR slope in the magnetoresistance effect element (magnetic multilayer film) of the second invention and a comparative example, when the heat treatment is conducted at a temperature of 250° C. to 450° C. under various pressures.

Furthermore, FIG. 13 shows variation of the MR slope when the sample 2-1 of the table 2 is thermally treated under various pressure values. At 250° C., little variation occurs in the MR slope under any pressure. However, at 350° C., some variation occurs in accordance with the applied pressure. That is, the MR slope keeps a large value for the heat treatment in a pressure range lower than $10^{-7}$ Torr, however, the MR slope is deteriorated in a pressure range higher than $10^{-7}$ Torr. This is because the magnetic multilayer film is oxidized by a slight amount of residual oxygen although it is called as a vacuum state. However, at 450° C., the MR slope is also deteriorated under a pressure of $10^{-9}$ Torr. Accordingly, it is understood that the MR slope keeps a large value in the heat treatment of the temperature below 400° C. and of the pressure of lower than $10^{-7}$ Torr.

Furthermore, in the invention of the magnetoresistance effect element 4 having the magnetic multilayer film 2 (corresponding to FIG. 4), was performed an experiment of examining what effects are brought to the characteristics of the multilayer film by the relationship among the resistivity $\rho_p$ of the pinning layer, the resistivity $\rho_f$ of the ferromagnetic layer and the resistivity $\rho_s$ of the soft magnetic layer. That is, magnetic multilayer films responding to FIG. 4) having various laminate compositions as shown in the following table 4 were prepared, and the resistivity of each layer, $\rho_p$, $\rho_f$, $\rho_s$ and the value $R^* = \rho_p/[(\rho_s + \rho_f)/2]$ were calculated. In addition, the MR value and the MR slope for each sample was measured. The result is shown in the following table 4. The value $R^* = \rho_p/[(\rho_s + \rho_f)/2]$ was found out to be excellent in a range of 3 to 30, that is, the samples 4-1 to 4-4 satisfying the following equation (1) exhibit excellent results.

$$3((\rho_f + \rho_s)/2) < \rho_p < 30((\rho_f + \rho_s)/2) \qquad \text{equation (1)}$$

TABLE 4

| Sample No. | Material ($m_s$, $m_f$, $m_p$) | $\rho_s$ | $\rho_f$ ($\mu\Omega$cm) | $\rho_p$ | R* | MR ratio (%) | MR slope (%/Oe) |
|---|---|---|---|---|---|---|---|
| 4-1 | (NiFe, NiFe, FeMn) | 27.3 | 27.3 | 124 | 4.5 | 1.8 | 0.57 |
| 4-2 | (NiFeCo, Co, FeMn) | 28.8 | 24.6 | 124 | 4.6 | 3.5 | 0.60 |
| 4-3 | (CoNiFe, CoFe, FeCoMn) | 24.7 | 29.6 | 147 | 5.4 | 3.8 | 0.56 |
| 4-4 | (NiFe, Co, CrSb) | 27.3 | 24.6 | 358 | 13.8 | 2.1 | 0.54 |
| 4-5 | (NiFe, NiFe, CoPt) | 27.3 | 27.3 | 34.1 | 1.2 | 1.7 | 0.37 |
| 4-6 | (NiFe, Co, CoFe) | 27.3 | 24.6 | 29.6 | 1.1 | 1.6 | 0.41 |

Figure 18:
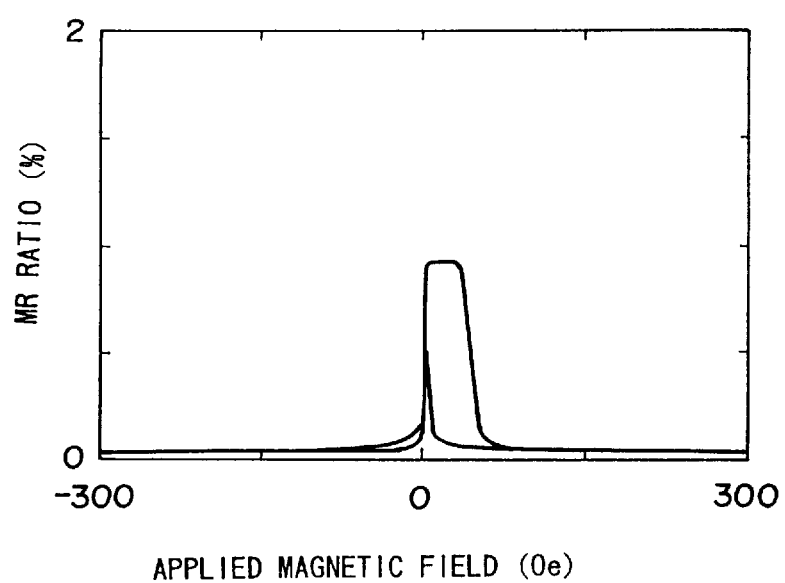
FIG. 18 is a graph showing the MR curve of a comparative example sample 5-1.

$m_s$: matetial of soft magnetic layer
$m_f$: matetial of ferromagnetic layer
$m_p$: matetial of pinning layer
R* = $\rho_p/[(\rho_s + \rho_f)/2]$ Next, in order to consider the laminating order of the respective layers of the magnetoresistance effect element having the magnetic multilayer film 2 (corresponding to FIG. 4) of the invention, a magnetic multilayer film of a comparative sample 5-1 whose laminating order was different from that of the magnetic multilayer film 2 (corresponding to FIG. 4 of the present invention was prepared. That is, the magnetic multilayer film of the comparative sample 5-1 was formed by successively laminating, on a Ta undercoat layer (50 Å), NiFe(70 Å)/Cu(30 Å)/NiFe (70 Å)/FeMn(70 Å)/Cu(30 Å)/NiFe(70 Å)/Cu(30 Å)/NiFe (70 Å)/FeMn(70 Å)/Cu(50 Å). This film was obtained by using the magnetic multilayer film 1 shown in FIG. 1 as a basic unit and stacking the basic units in the same laminating order so that Cu(30 Å) was sandwiched between the two basic units. The MR curve of the comparative sample 5-1 is shown in FIG. 18. From the graph of FIG. 18, the comparative sample 5-1 has an extremely small MR ratio as indicated on the ordinate, and a MR ratio curve in which an applied magnetic field is increased and a MR ratio curve in which an applied magnetic field is decreased, are not coincident with each other in the vicinity of the zero magnetic field, so that this sample was found to be unusable practically. This shows that even if the layers are successively laminated from the Ta undercoat layer side and the NiFe layer serving as the first ferromagnetic layer and even if the FeMn layer serving as the pinning layer are coupled to each other with the epitaxial growth, the epitaxial growth is gradually lost as the lamination further proceeds in the order of Cu, NiFe and Cu again, and finally the epitaxial relationship cannot be obtained between subsequent NiFe-FeMn layers. Accordingly, in order to pin the ferromagnetic layer most efficiently, it is best that the ferromagnetic layers are formed at the upper and lower sides of the pinning layer like the magnetic multilayer film 2 of the present invention (corresponding to FIG. 4), and these layers are epitaxially formed.

Further, the following examples 3 to 6 and a comparative example 1 will be described as the invention of the first MR head as a magnetoresistance device and a comparative example.

EXAMPLE 3

Ta of 50 Å thickness was formed as a metal undercoat layer on an AlTiC substrate, and NiFe(70 Å)-Cu(30 Å)-NiFe (70 Å)-FeMn(70 Å) were successively laminated on the metal undercoat layer to form a magnetic multilayer film. NiFe represents $Ni_{0.81}Fe_{0.19}$. The film forming condition was as follows: ultimate pressure of $2\times10^{-7}$ Torr, pressure of $1.4\times10^{-4}$ Torr at film formation time and substrate temperature of about 10° C., and the film formation of each material was performed by the ion beam sputtering method at a film growth rate of 0.2 to 0.3 Å/sec while a magnetic field was applied in a direction of a parallel to a measurement electric current and in an in-plane direction during the film formation process. The epitaxial growth coupling was confirmed between the NiFe-FeMn layers.

Figure 14:
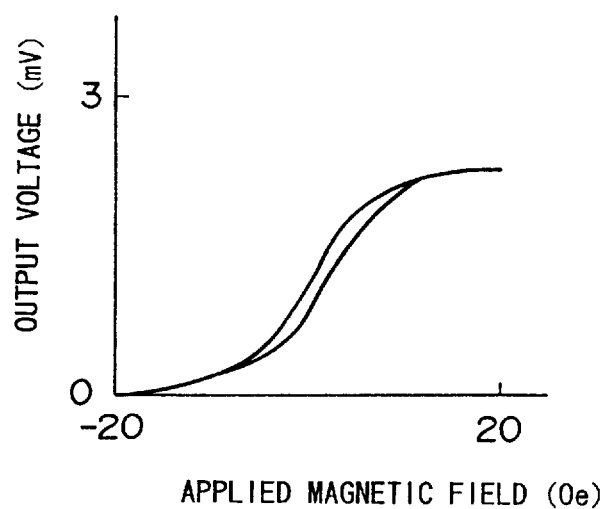
FIG. 14 is a chart showing an applied magnetic field and an output voltage in the magnetoresistance device (MR head) of the first invention.

Thereafter, a pattern of 20 $\mu$m×6 $\mu$m was formed as a magnetically-sensitive portion using a photolithographic technique, and an electrode having a track width of 3 $\mu$m was formed on the pattern to form an MR head. The structure of the MR head thus formed is shown in FIG. 5. Thereafter, it was cooled from 150° C. under a pressure of $10^{-5}$ Torr while magnetic field of 200 Oe was applied in a direction of a perpendicular to the measurement electric current and in the in-plane direction, thereby the pinning effect of the ferromagnetic layer was induced. FIG. 14 shows variation of the output voltage obtained when the measurement electric current was set to 5 mA and the external magnetic field was varied in a range of ±20 Oe at 50 Hz. According to the MR head using the artificial lattice magnetic multilayer film of the present invention, the output voltage of about 2.2 mV could be obtained.

Comparative Example 1

An MR head utilizing the anisotropic magnetoresistance effect which has been hitherto used was prepared as a comparative example with permalloy under the same condition as the embodiment 3. The measurement electric current was set to 5 mA and the external magnetic field was varied in a range of ±20 Oe at 50 Hz. The output voltage at this time was equal to 0.8 mV.

From the comparison between the example 3 and the comparative example 1, the first MR head of the present invention can obtain about three times as high as the output of the conventional example. Accordingly, the effect of the present invention is clear.

EXAMPLE 4

Ta of 50 Å thickness was formed as a metal undercoat layer on an AlTiC substrate, and NiFe(70 Å)-Cu(30 Å)NiFe (70 Å)-FeMn(70 Å)-NiFe(70 Å)-Cu(30 Å)-NiFe(70 Å) were successively laminated on the metal backing layer to form a magnetic multilayer film. The film forming condition was as follows: ultimate pressure of $1.7\times10^{-7}$ Torr, pressure of $1.4\times10^{-4}$ Torr at film formation time and substrate temperature of about 10° C., and the film formation of each material was performed by the ion beam sputtering method at a film growth rate of 0.2 to 0.3 Å/sec while a magnetic field was applied in a direction of a parallel to a measurement electrical current and in an in-plane direction during the film formation process. Thereafter, it was cooled from 150° C.

under a pressure of $10^{-5}$ Torr while magnetic field of 200 Oe was applied in a direction of a perpendicular to the measurement electric current and in the in-plane direction, thereby the pinning effect of the ferromagnetic layer was induced. The other condition was set to be identical to that of the example 3, and the MR head was formed. It was confirmed that the NiFe—FeMn—NiFe were coupled to one another with the epitaxial growth.

Figure 15:
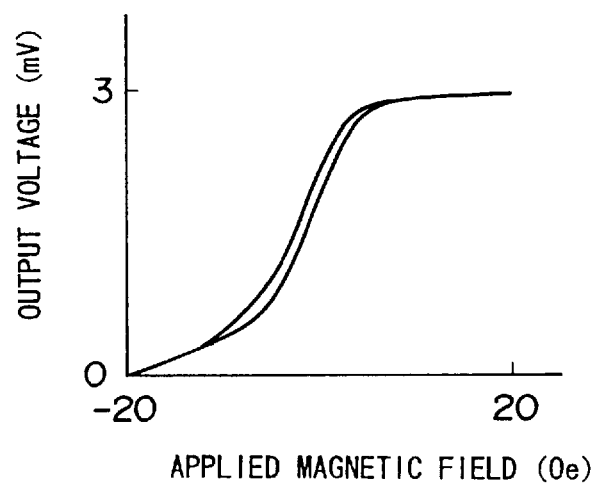
FIG. 15 is a chart showing an applied magnetic field and an output voltage in the magnetoresistance (MR head) of the second invention.

The structure of the MR head thus formed is shown in FIG. 5. FIG. 15 shows variation of the output voltage obtained when the external magnetic field was varied in a range of ±20 Oe at 50 Hz. According to the MR head using the artificial lattice magnetic multilayer film of the present invention, the output voltage of about 3.0 mV could be obtained. As compared with the example 3, the resistance value between the electrodes was reduced by about 30%. This was because the resistivity of the magnetic multilayer film was reduced. This is favorable for the operation of the MR head because a heating due to the measurement electric current can be more suppressed as the resistivity is small.

In addition, the deterioration of the characteristics of the MR head due to the heating can be also suppressed. It was confirmed that the MR head of the present invention had about 3.8 times as large as the effect of the conventional example.

EXAMPLE 5

Figure 16:
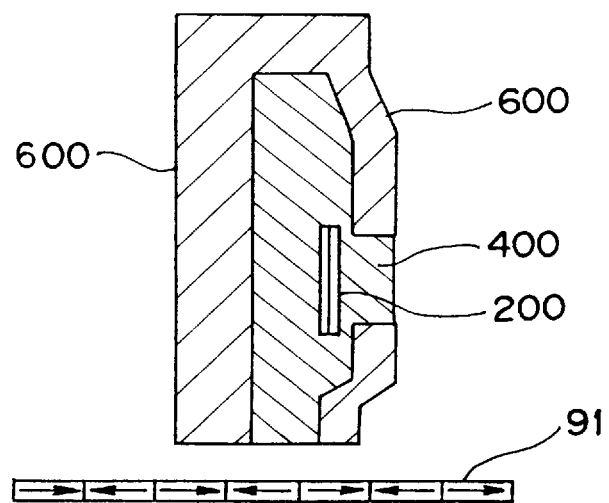
FIG. 16 is a partially-omitted cross-sectional view showing an embodiment in which the magnetoresistance effect element (magnetic multilayer film) of the present invention is applied to a yoke type MR head.

Furthermore, FIG. 16 shows an embodiment in which the magnetoresistance effect element of the present invention is applied to a yoke type MR head. In this embodiment, a part of yokes 600, 600 for guiding magnetic flux is provided with a cut-out portion, and a magnetoresistance effect element 200 was formed through a thin insulting film 400 therebetween. The magnetoresistance effect element 200 is provided with an electrode (not shown) through which a electric current flows in a direction of a parallel or perpendicular to the direction of a magnetic path formed by the yokes 600, 600. As a result, the output which was two times as high as that of the MR head using permalloy was obtained. In the magnetic multilayer film of the present invention, the rise-up characteristic in the vicinity of the zero magnetic field is excellent, and thus a shunt layer and a bias magnetic field applying means which are usually used, may not be provided.

EXAMPLE 6

Figure 17:
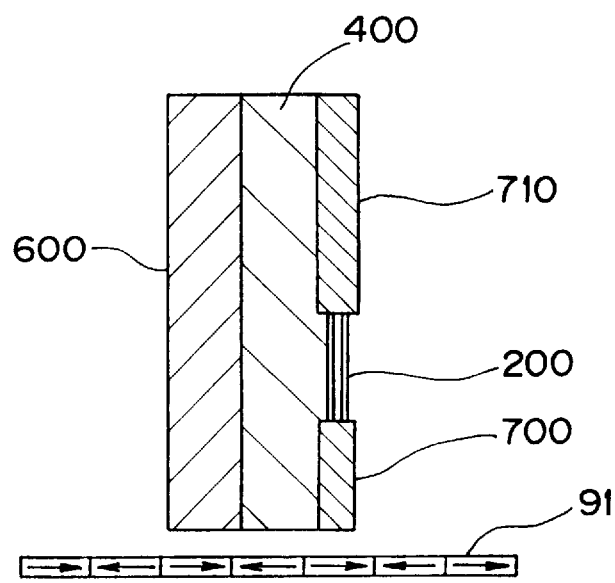
FIG. 17 is a partially-omitted cross-sectional view showing an embodiment in which the magnetoresistance effect element (magnetic multilayer film) of the present invention is applied to a flux guide type MR head.

FIG. 17 shows another embodiment in which a magnetoresistance device, for example, an MR head is constructed by the magnetoresistance effect element of the present invention. The magnetoresistance effect element 200 is formed in contact with high-resistivity flux guide layers 700, 710 magnetically. The flux guide layers are formed of material whose resistivity is three times or more as high as the resistivity of the magnetic multilayer film 200, so that substantially no measurement electrical current flowing in the magnetic multilayer film 200, flows in the flux guide layers 700, 710. On the other hand, since the flux guide layer 700 and the magnetic multilayer film 200 are magnetically contacted with each other, the signal magnetic field is guided to the flux guide layer 700 and reaches the magnetic multilayer film 200 without losing its intensity. Reference numeral 600 represents another different flux guide layer, and it acts as a return guide for magnetic flux passing through the magnetic multilayer film 200. This flux guide layer 600 may be provided at each of both sides of the magnetoresistance effect element 200 and the pair of the high-resistivity flux guide layers 700, 710. Furthermore, the guide layers 710 and 600 may be contacted with the medium at a far end portion. At this time, the output was estimated as being three times as large as that of an MR head using permalloy. Reference numeral 400 represents a non-magnetic insulating layer.

As described above, according to the first invention on the magnetoresistance effect element having the magnetic multilayer film 1, it has a MR slope of 0.3%/Oe or more. In addition, the rise-up characteristic of the MR curve in the vicinity of the zero magnetic field, is extremely excellent, and it has high heat resistance. According to the second invention on the magnetoresistance effect element having the magnetic multilayer film 2, in addition to the above effects, it has a MR slope at a high frequency of 1 MHz of 0.3%;Oe or more, and has a low resistivity. Furthermore, the characteristic is not deteriorated even by the heat treatment before and after 350° C. insofar as the pressure is below $10^{-7}$ Torr. In the magnetoresistance device, for example, MR head using the magnetoresistance effect element having the magnetic multilayer film 1, the output voltage is approximately three times as high as that of the conventional material.Furthermore, in the magnetoresistance device, for example,MR head using the magnetoresistance effect element having the magnetic multilayer film 2, the MR slope in the high-frequency area has a high value of 0.3%/Oe or more and a low resistivity, and the heating due to the measurement electric current is small, and a 3.8-times output voltage can be obtained. Accordingly, there can be provided an excellent MR head which has extremely high reliability and enables the reading for ultrahigh density magnetic recording which exceeds 1 Gbit/inch².

What is claimed is:

1. A magnetoresistance device, comprising a magnetoresistance effect element, conductive films and electrode portions, wherein said conductive films are conductively connected to said magnetoresistance effect element through said electrode portions, and said magnetoresistance effect element comprises a non-magnetic metal layer which is formed of material containing at least one material selected from the group consisting of Au, Ag and Cu, a ferromagnetic layer formed on one surface of the non-magnetic metal layer which has a composition represented by $(Co_zNi_{1-z})_wFe_{1-w}$ wherein $0.4 \leq z \leq 1.0, 0.5 \leq w \leq 1.0$ by weight, a soft magnetic layer formed on the other surface of said non-magnetic metal layer which has a composition represented by $Co_t M_u M^1_q B_r$, wherein $0.6 \leq t \leq 0.95$, $0.01 \leq u \leq 0.2$, $0.01 \leq q \leq 0.1$, $0.05 \leq r \leq 0.3$ by atomic ratio; M represents at least one material selected from the group consisting of Fe and Ni, and $M^1$ represents at least one material selected from the group consisting of Zr, Si, Mo and Nb, and a pinning layer which is formed on said ferromagnetic layer to pin a direction of magnetization of said ferromagnetic layer which is at least one selected from the group consisting of an antiferromagnetic layer, a hard magnetic layer, a pinning ferromagnetic layer which is formed of a material different from said ferromagnetic layer coupled to said pinning layer, and a layer formed by introducing artificial structural defects in the surface of said ferromagnetic layer coupled to said pinning layer, and wherein said ferromagnetic layer and each of said pinning layer are coupled to each other with epitaxial growth.

2. The magnetoresistance device as claimed in claim 1, wherein said hard magnetic layer constituting said pinning layer is formed from at least one metal selected from Fe, Co and Ni, or from an alloy containing 50 wt % or more of one metal selected from Fe, Co and Ni.

3. The magnetoresistance device as claimed in claim 1, wherein said antiferromagnetic layer constituting said pinning layer is formed of material containing at least two materials selected from Fe, Ni, Co, Cr, Mn, Ru, Rh, Mo and O.

4. The magnetoresistance device as claimed in claim 1, wherein the thickness of each of said ferromagnetic layer and said soft magnetic layer is set to 20 to 100 Å.

5. The magnetoresistance device as claimed in claim 1, wherein the thickness of said ferromagnetic layer is set to 20 to 60 Å, and the thickness of said soft magnetic layer is set to 40 to 100 Å.

6. The magnetoresistance device as claimed in claim 1, wherein the thickness of said non-magnetic metal layer is set to 20 to 60 Å.

7. The magnetoresistance device as claimed in claim 1, wherein the thickness of said pinning layer is set to 50 to 700 Å.

8. The magnetoresistance device as claimed in claim 1, wherein representing the resistivity of said pinning layer, the resistivity of said ferromagnetic layer and the resistivity of said soft magnetic layer by $\rho_p$, $\rho_f$ and $\rho_s$, the relationship in resistivity satisfies the following equation:

$$3((\rho_f+\rho_s)/2)<\rho_p<30((\rho_f+\rho_s)/2).$$

9. The magnetoresistance device as claimed in claim 1, wherein said magnetoresistance effect element has a slope of magnetoresistance change which is equal to 0.2%/Oe or more at a hysteresis width of 6 Oe under high-frequency magnetic field of 1 MHz.

10. The magnetoresistance device as claim 1, wherein said magnetoresistance device is a magnetoresistance effect type head.

11. The magnetoresistance device as claimed in claim 10 which is free of a biasing magnetic field applying mechanism.

12. The magnetoresistance device as claimed in claim 10, wherein said ferromagnetic layer is formed while external magnetic field of 10 to 300 Oe is applied in the same direction as signal magnetic field and in a film in-plane direction at the film formation time, and said soft magnetic layer is formed while external magnetic field of 10 to 300 Oe is applied in a direction of a perpendicular to the direction of signal magnetic field and in a film in-plane direction at the film formation time.

13. The magnetoresistance device as claimed in claim 10, wherein said magnetoresistance effect element contains end portions at each end thereof, and wherein said end portions are coupled to said electrode portions so that the whole end portions thereof are contacted with said electrode portions.

14. The magnetoresistance device as claimed in claim 13, further comprising a linking soft magnetic layer between said electrode portions which are formed at both end portions of said magnetoresistance effect element, wherein said linking soft magnetic layer and the whole end portions of the said magnetoresistance effect element are connected to each other in contact with each other.

15. The magnetoresistance device as claimed in claim 14, wherein said linking soft magnetic layer is continuously formed between said magnetoresistance effect and said electrode portions formed at both end portions of said magnetoresistance effect element and in contact with the lower surfaces of said electrode portions.

16. A magnetoresistance effect element comprising a non-magnetic metal layer which is formed of material containing at least one material selected from the group consisting of Au, Ag and Cu, a ferromagnetic layer formed on one surface of the non-magnetic metal layer which has a composition represented by $(Co_zNi_{1-z})_wFe_{1-w}$, wherein $0.4 \leq z \leq 1.0$, $0.5 \leq w \leq 1.0$ by weight, a soft magnetic layer formed on the other surface of said non-magnetic metal layer which has a composition represented by $Co_tM_uM^1_qB_r$, wherein $0.6 \leq t \leq 0.95$, $0.01 \leq u \leq 0.2$, $0.01 \leq q \leq 0.1$, $0.05 \leq r \leq 0.3$ by atomic ratio; M represents at least one material selected from the group consisting of Fe and Ni, and $M^1$ represents at least one material selected from the group consisting of Zr, Si, Mo and Nb, and a pinning layer which is formed on said ferromagnetic layer to pin a direction of magnetization of said ferromagnetic layer which is at least one selected from the group consisting of an antiferromagnetic layer, a hard magnetic layer, a pinning ferromagnetic layer which is formed of material different from said ferromagnetic layer coupled to said pinning layer, and a layer formed by introducing artificial structural defects in the surface of said ferromagnetic layer coupled to said pinning layer, and wherein said ferromagnetic layer and each of said pinning layer are coupled to each other with epitaxial growth.

17. The magnetoresistance device as claimed in claim 16, wherein representing the resistivity of said pinning layer, the resistivity of said ferromagnetic layer and the resistivity of said soft magnetic layer by $\rho_p$, $\rho_f$ and $\rho_s$, the relationship in resistivity satisfies the following equation:

$$3((\rho_f+\rho_s)/2)<\rho_p<30((\rho_f+\rho_s)/2) \qquad \text{equation (1).}$$

18. The magnetoresistance device as claimed in claim 16, wherein said magnetoresistance effect element has a slope of magnetoresistance change which is equal to 0.2%/Oe or more at a width of 6 Oe under high-frequency magnetic field of 1 MHz.

* * * * *